United States Patent
Miyazaki et al.

[11] Patent Number: 6,016,562
[45] Date of Patent: *Jan. 18, 2000

[54] INSPECTION DATA ANALYZING APPARATUS FOR IN-LINE INSPECTION WITH ENHANCED DISPLAY OF INSPECTION RESULTS

[75] Inventors: Yoko Miyazaki; Nobuyoshi Hattori; Junko Izumitani; Masahiko Ikeno, all of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/919,166

[22] Filed: Aug. 28, 1997

Related U.S. Application Data

[63] Continuation of application No. 08/664,431, Jun. 18, 1996, abandoned.

Foreign Application Priority Data

Jan. 12, 1996 [JP] Japan .................................... 8-004227

[51] Int. Cl.$^7$ ............................. G01R 31/28; G06F 11/10
[52] U.S. Cl. ...................... 714/724; 714/745; 326/158.1; 356/237
[58] Field of Search .................................... 714/724, 725, 714/718, 745; 324/73.1, 158.1; 382/309, 149; 356/237, 73.1

[56] References Cited

U.S. PATENT DOCUMENTS

| | | | |
|---|---|---|---|
| 4,571,999 | 2/1986 | Arita et al. | 73/598 |
| 4,628,531 | 12/1986 | Okamoto et al. | 382/8 |
| 5,016,099 | 5/1991 | Bongardt et al. | 358/106 |
| 5,038,048 | 8/1991 | Maeda et al. | 250/563 |
| 5,179,419 | 1/1993 | Palmquist et al. | 356/73.1 |
| 5,204,911 | 4/1993 | Schwartz et al. | 382/8 |
| 5,266,890 | 11/1993 | Kumbasar et al. | 324/158 R |
| 5,479,252 | 12/1995 | Worster et al. | 356/237 |
| 5,497,381 | 3/1996 | O'Donoghue et al. | 371/28 |
| 5,544,256 | 8/1996 | Brecher et al. | 382/149 |

FOREIGN PATENT DOCUMENTS

| | | |
|---|---|---|
| 6-61314 | 3/1994 | Japan . |
| 6-275688 | 9/1994 | Japan . |
| 8-201270 | 8/1996 | Japan . |

*Primary Examiner*—Hoa T. Nguyen
*Attorney, Agent, or Firm*—Oblon, Spivak, McClelland, Maier & Neustadt, P.C.

[57] ABSTRACT

An ordinary user can easily learn a step at which a problem occurs during semiconductor manufacturing processes and improve the yield of manufacturing products and the quality of the products. At a certain in-line inspection step, a CPU (3) stores data signals (V1) taken by an inspection apparatus (1) into a memory (2), and reads a result (V6) obtained at a precedent step and stores the same in the memory (2). The CPU (3) reads stored data signals (V2) from the memory (2), performs comparison or referral on data about defects which are detected at a current step and the result (V6) regarding the precedent step, and generates a defect data analysis processing result signal (V5) regarding the current step. The result (V5) consists of disappeared defect data, common defect data, new defect data to which a label of a current step number is assigned, and reappeared defect data. The CPU (3) performs the processing above for each in-line inspection step, edits resultant data, and generates histogram data which provide the number of detected defects and the number of disappeared defects for each step.

17 Claims, 17 Drawing Sheets p : ±100 μm

DEFECT SIZE
⇩
- • 0.5 μm OR SMALLER
- ⊘ 0.5~1 μm
- ◯ 1~5 μm
- ⬤ 5 μm OR LARGER

DEFECT SIZE
⇩
- • 0.5 μm OR SMALLER
- ⊘ 0.5~1 μm
- ◯ 1~5 μm
- ⬤ 5 μm OR LARGER

DEFECT SIZE
⇩
- • 0.5 μm OR SMALLER
- ⊘ 0.5~1 μm
- ◯ 1~5 μm
- ⬤ 5 μm OR LARGER

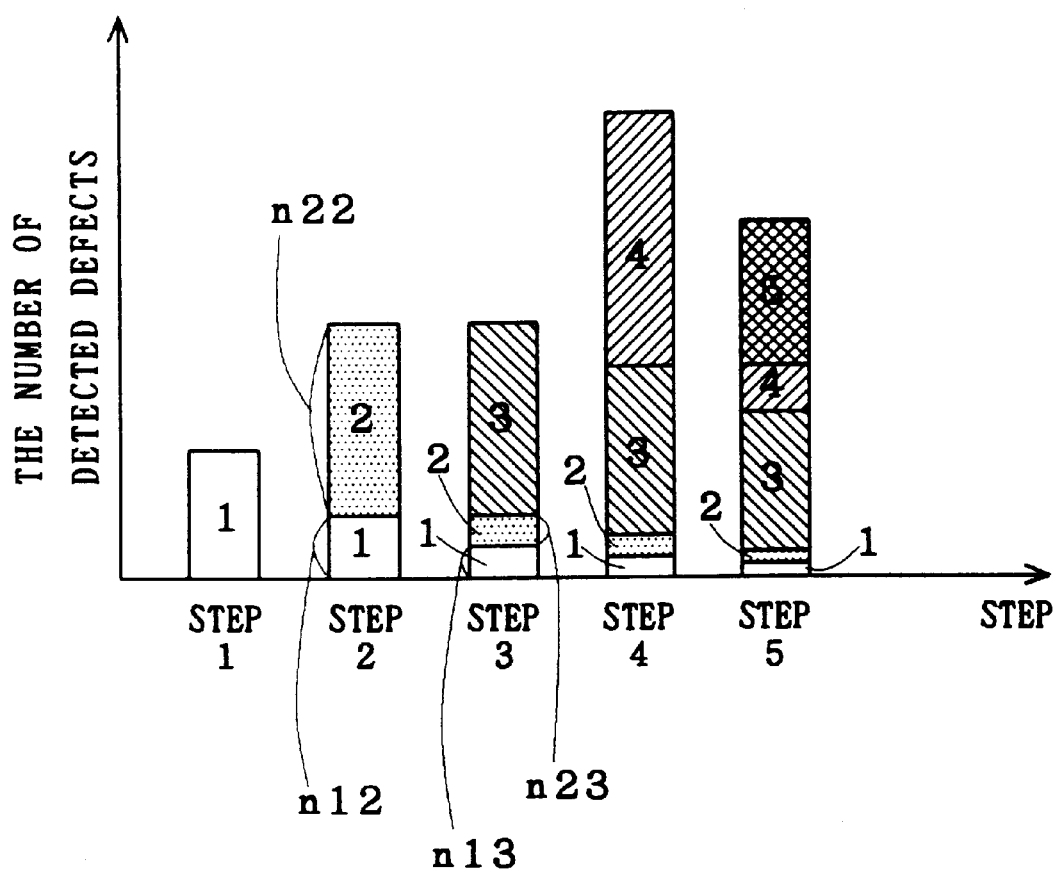

INSPECTION DATA ANALYZING APPARATUS FOR IN-LINE INSPECTION WITH ENHANCED DISPLAY OF INSPECTION RESULTS

This application is a Continuation of application Ser. No. 08/664,431, filed on Jun. 18, 1996, now abandoned.

BACKGROUND OF THE INVENTION

1. Field of the Invention

The present invention relates to an inspection data analyzing apparatus for use during each semiconductor processing step, i.e., during in-line inspection of a semiconductor.

2. Description of the Background Art

During conventional in-line inspection of a semiconductor, an inspection apparatus detects positional coordinate data (i.e., XY-coordinate data) of a defect within a semiconductor wafer, and based on the detected defect data, the inspection apparatus or an inspection data analyzing apparatus displays the position of each detected defect as a dot on a display apparatus which is included in the inspection apparatus or the inspection data analyzing apparatus. FIG. 24 shows an example of a map display on such a display apparatus. As shown in FIG. 24, a conventional inspection data analyzing apparatus displays dots DT at positions where defects are detected, so as to inform a user of information expressing a distribution of the detected defects.

In addition, from the positional data regarding the detected defects which are supplied by the inspection apparatus, the conventional inspection data analyzing apparatus calculates data which express the number of detected defects for each inspection step, which is obtained by classifying the detected defect data by inspection step numbers upon detection of a first defect. The conventional inspection data analyzing apparatus then processes the resulting data into a histogram and outputs the histogram to the display apparatus. In other words, the inspection apparatus inspects the same wafer repeatedly every time manufacturing of a semiconductor proceeds to the next step while XY-coordinate data on each detected defect are verified within an optional tolerance range and inspection data for the respective steps are overlapped, thereby creating the data which express the number of detected defects for the respective steps which are classified by the numbers assigned to the respective steps which are precedent to the current step. FIG. 25 shows an example of a displayed histogram regarding the number of detected defects for the respective steps obtained in this manner.

In FIG. 25, the figures in the histogram regarding the number of detected defects for the respective steps denote the number which is assigned to each manufacturing step or each inspection step. For instance, n12 defects are among defects which are created at the manufacturing step 1 are still detected during the inspection step 2 even after the manufacturing step 2 is completed. During the inspection step 3, n13 defects are among the defects which are created at the manufacturing step 1 and n23 defects are among defects which are created at the manufacturing step 2 are still detected even at the end of the manufacturing step 3.

Thus, the histogram in FIG. 25 shows a user at which step a detected defect appeared for the first time.

However, a user finds the following problems with the conventional inspection data analyzing apparatus.

First, since a map displaying the detected defects allows a user to read only the detected positions of the detected defects, the user cannot sufficiently read the situation in which the defects were created only from the information available from the map. Thus, when the user needs to determine which defect is to be studied to investigate a dust source or to solve a process-related problem, the map as it is conventionally displayed cannot sufficiently supply information needed for such judgement and is virtually almost useless.

Second, users in general cannot accurately read the total number of defects which exist in the wafer as a whole from the histogram as it is conventionally displayed. That is, since manufacturing steps such as a film formation step and an etching step are repeatedly executed during semiconductor processes, the accuracy of detecting defects varies among inspection steps. Due to this, even when defects are detected at one inspection step, after the next manufacturing step, the detected defects may not be detected at the next inspection step. Although this causes no problem if the detected defects completely disappear during the next manufacturing step, in reality, it is likely that the detected defects become invisible through the next manufacturing step such as a film formation step and reappear after a further manufacturing step. Therefore, the largest problem resides at the manufacturing step where such defects which reappear later are initially created. For semiconductor processes, it is important to find such a manufacturing step.

Meanwhile, an experienced user is well aware of such nature as above of defects. To an experienced user, the information obtainable from the conventional histogram in FIG. 25 may be sufficient. However, to ordinary users, it is extremely difficult or impossible to read information related to defects which disappear once and appear again later from the histogram in FIG. 25. When using the conventional inspection data analyzing apparatus, ordinary users are very likely to misjudge that an excellent quality wafer is manufactured with only a few defects created during the respective steps.

These problems can be attributed to a fact that conventional inspection apparatuses and conventional inspection data analyzing apparatuses are developed mainly from a manufacturer's point of view and that those apparatuses do not meet the demands from ordinary users.

SUMMARY OF THE INVENTION

A first aspect of the present invention is directed to an inspection data analyzing apparatus for in-line inspection, which analyzes each one of detected defect data signals which are obtained on a semiconductor wafer for each one of inspection steps which follows a corresponding optional step of semiconductor manufacturing steps, comprising: (a) means for receiving the detected defect data signals and for generating defect data analysis processing result signals which are related to a first one of the inspection steps, based on the detected defect data signals at the first one of the inspection steps; and (b) means for receiving the detected defect data signals and for comparing each one of the detected defect data signals with the defect data analysis processing result signals which are related to a precedent one of the inspection steps which is immediately precedent to a current one of the inspection steps, to thereby generate the defect data analysis processing result signals regarding the current one of the inspection steps, for each one of the inspection steps after the first inspection step; wherein the defect data analysis processing result signals comprise disappeared defect data signals and non-disappeared detect data signals, the disappeared detect data signals provide data which are related to at least a disappeared defect which is judged as disappeared since the disappeared defect is detected at any one of the inspection steps which is prior to the current one of the inspection steps but is not detected at the current one of the inspection steps, and the non-disappeared detect data signals provide data which are related to at least a non-disappeared defect which can be judged as non-disappeared since the non-disappeared defect is detected at the current one of the inspection steps.

A second aspect of the present invention is directed to an inspection data analyzing apparatus for in-line inspection which analyzes detected defect data signals which are obtained on a semiconductor wafer by an inspection apparatus every time each one of semiconductor manufacturing steps is complete, comprising: (a) means for receiving the detected defect data signals and for obtaining data signals which provide defect densities per predetermined unit area, from the detected defect data signals, for each one of inspection steps; (b) means for calculating drawing data signals which provide at least a density profile curve, based on the data signals which are obtained by the data signal obtaining means (a), for each one of the inspection steps; and (c) means for graphically displaying the density profile curve based on the drawing data signals which are obtained by the calculating means (b).

A third aspect of the present invention is directed to an inspection data analyzing apparatus for in-line inspection which analyzes detected defect data signals which are obtained on a semiconductor wafer after an optional point of time after two or more steps of inspection steps are complete, comprising: (a) means for receiving the detected defect data signals and for judging to which one of predetermined levels a defect size provided by each one of the detected defect data signals belongs, to thereby generate drawing data signals which provide the levels to which defects belong with predetermined display forms which are different from each other for each one of inspection steps; and (b) means for graphically displaying the display forms based on the drawing data signals which are obtained by the judging and generating means (a), for each one of the inspection steps.

A fourth aspect of the present invention is directed to an inspection data analyzing apparatus for in-line inspection which analyzes detected defect data signals which are obtained on a semiconductor wafer by an inspection apparatus after an optional point of time after two or more steps of inspection steps are complete, comprising: (a) means for receiving the detected defect data signals and for obtaining defect density data signals which provide defect densities per chip based on the detected defect data signals, and for judging to which one of levels assigned in advance each one of the defect density data signals belong, to thereby generate drawing data signals which provide each one of the levels to which each one of the defect density data signals belongs with predetermined display forms, for each one of inspection steps; and (b) means for graphically displaying the display forms based on the drawing data signals which are obtained by the drawing data generating means (a), for each one of the inspection steps.

A fifth aspect of the present invention is directed to an inspection data analyzing apparatus for in-line inspection which analyzes detected defect data signals which are obtained on a semiconductor wafer by an inspection apparatus after an optional point of time after two or more steps of inspection steps are complete, comprising: (a) means for receiving the detected defect data signals and for obtaining defect density data signals which provide defect densities per chip based on the detected defect data signals, to thereby generate drawing data signals for displaying values of the defect density data signals as numerical values, together with another drawing data signals which provide a chip arrangement map and a defect distribution map of wafer as they overlap each other, for each one of inspection step; and (b) means for displaying both the drawing data signals and the another drawing data signals which are obtained by the drawing data generating means (a), for each one of the inspection steps.

A sixth aspect of the present invention is directed to an inspection data analyzing apparatus for in-line inspection which analyzes detected defect data signals which are obtained on a semiconductor wafer by an inspection apparatus after an optional point of time after two or more steps of inspection steps are complete, comprising: (a) means for receiving the detected defect data signals, for obtaining critical ratio data signals which provide defect critical ratios per chip based on the detected defect data signals, and for judging to which one of levels, assigned in advance, each one of the critical ratio data signals belongs, to thereby generate first drawing data signals which provide each one of the levels to which each one of the critical ratio data signals belongs with predetermined display forms for each one of inspection steps; (b) means for generating second drawing data signals which provide a chip arrangement map and a defect distribution map of wafer as they overlap each other, for each one of the inspection step; and (c) means for graphically displaying the display forms based on the first and second detected defect data signals, for each one of the inspection step.

Accordingly, an object of the present invention is to realize a system of an inspection data analyzing apparatus which supplies such information with which general users who have no expertise, knowledge or experience regarding relationships between semiconductor processes and inspection data can judge whether each semiconductor manufacturing step is good or bad at a tremendously enhanced certainty and accuracy.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 24 and 25 are diagrams showing examples of an outputted display according to a conventional technique.

DESCRIPTION OF THE PREFERRED EMBODIMENTS

First Preferred Embodiment

Figure 1:
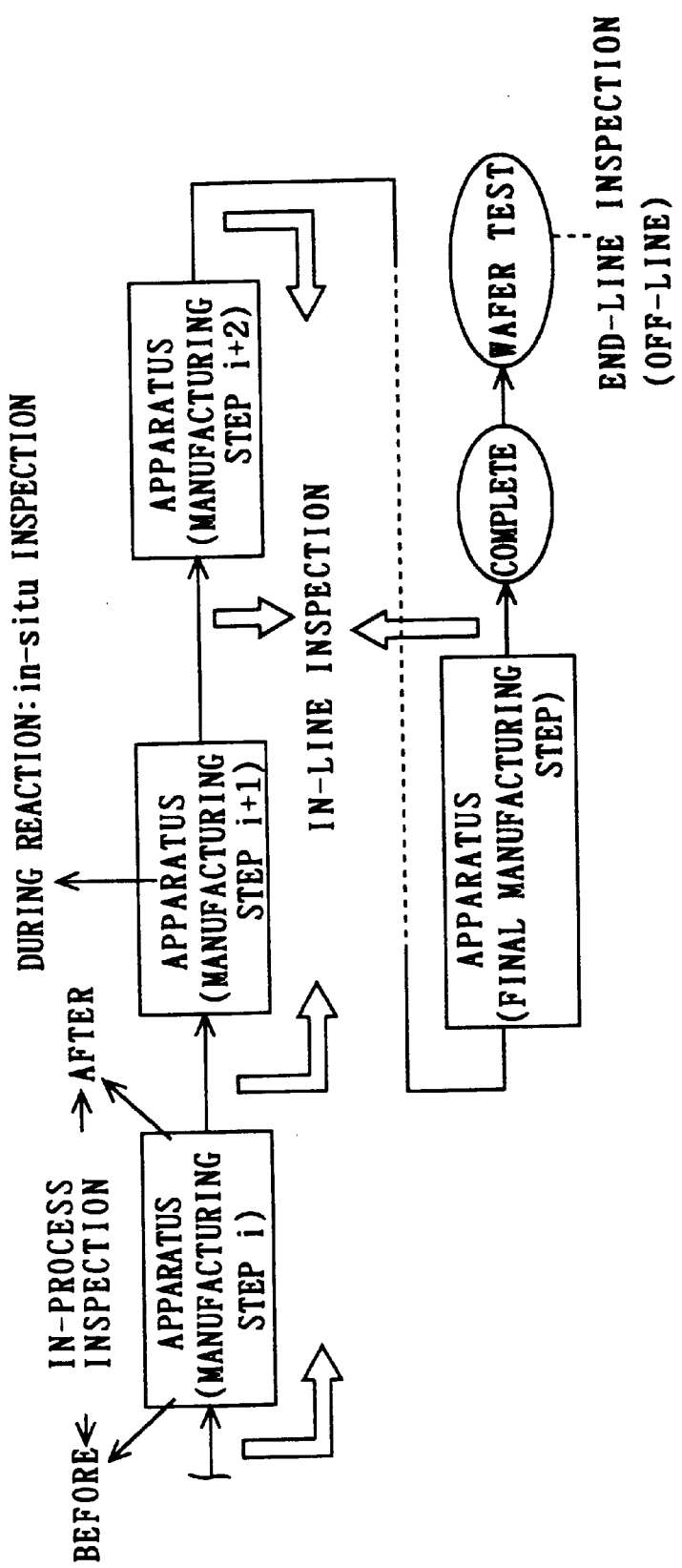
FIG. 1 is a diagram showing a field to which the present invention is applicable.

FIG. 1 is a schematic diagram showing a field to which the present invention is applicable. An inspection data analyzing apparatus according to the present invention is used during in-line inspection of a semiconductor, i.e., when a semiconductor wafer is transferred from apparatuses which are in charge of manufacturing steps into an inspection apparatus every time an optional manufacturing step is completed, in order to measure defects in the wafer and process resultant measurement data. Hence, the inspection data analyzing apparatus according to the present invention is not used for in-process inspection (namely, inspection which is performed by a process apparatus itself prior to or after a certain manufacturing process; e.g., inspection which is performed immediately after a film is formed within a film forming apparatus), in si-tu inspection (namely, inspection of a semiconductor which is performed during reaction within an apparatus which is in charge of a manufacturing step), nor end-line or off-line inspection (i.e., a test on a completed wafer).

Figure 2:
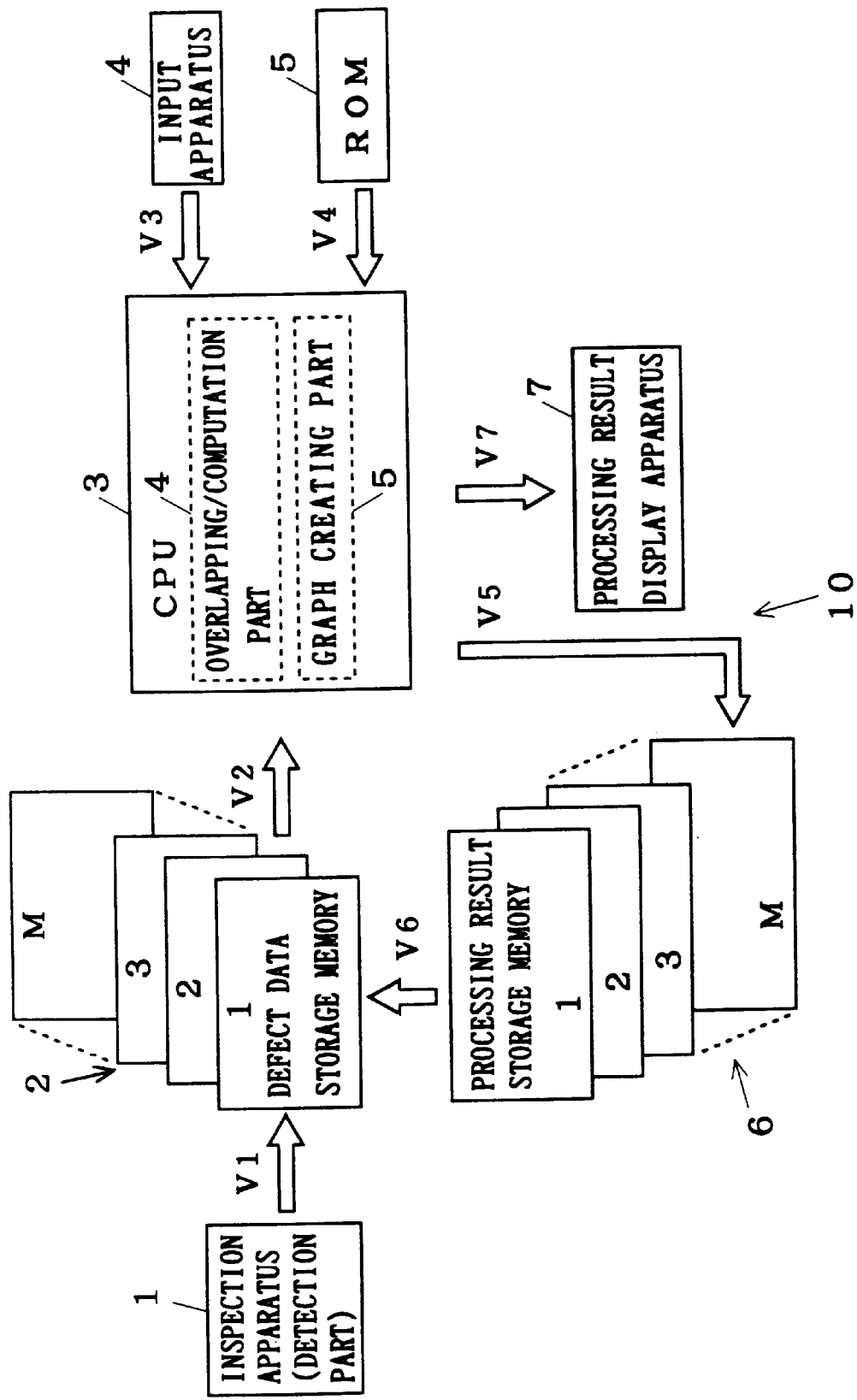
FIG. 2 is a block diagram showing the structure of an inspection data analyzing apparatus according to a first preferred embodiment of the present invention.

FIG. 2 is a block diagram showing an example of the structure of such an inspection data analyzing apparatus which is designed especially for in-line inspection. FIG. 2 shows the inspection apparatus (detection part) 1, in addition to the inspection data analyzing apparatus 10. The apparatus 1 detects a defect in a semiconductor wafer and outputs physical quantity data, such as position coordinate data (XY-coordinate data) regarding detected defects and surface area data of the detected defects, as data signals V1. The apparatus 1 may be an optical type apparatus which utilizes the intensity of scattered light to detect a defect (in this case, the physical quantity of a defect expressed by the data signals V1 is supplied as a pixel size), a mechanical type apparatus which directly measures and outputs a surface area value of a defect, etc.

As herein used, the term "defect" has a wide scope of meaning, covering not only a defect of a pattern but also a foreign matter, a dust and the like which exist within the pattern.

As shown in FIG. 2, the inspection data analyzing apparatus 10 is formed by a defect data storage memory 2 (first memory), a CPU 3, an input apparatus 4, a ROM 5, a processing result display apparatus 7, and a processing result storage memory 6 (second memory). Of these elements, each of the defect data storage memory 2 and the processing result storage memory 6 is a read/write memory and has a memory area for storing the data signals V1 and processed data signals V5 regarding detected defects for each inspection step which corresponds to each manufacturing step in one line. In FIG. 2, the figures allotted to the memory areas of the memories 2 and 6 correspond to the numbers which are assigned to the respective manufacturing steps and the respective inspection steps. The CPU 3 performs a core operation for controlling the apparatus 10 and a core operation for data analysis. In short, the CPU 3 includes an overlapping/computation part 4 and a graph creating part 5, as function parts which are necessary for data analysis. The input apparatus 4 is formed by a keyboard, a mouse, etc., and outputs an input signal V3 which supplies various types of user definition information to the CPU 3, in accordance with an instruction given by a user. The ROM 5 is a memory for storing a program data signal V4 which is necessary for the CPU 3 to perform various operations. The processing result display apparatus 7 is formed by a printer, a CRT display apparatus, etc. To a user, the processing result display apparatus 7 displays the defect data analysis result V5 for each inspection step or a defect data analysis result which is edited into a predetermined form after all inspection steps are completed.

In the following, a description will be continued on operations of the apparatus 10, based on the block diagram in FIG. 2 and with reference to flow charts which will be described later.

Figure 3:
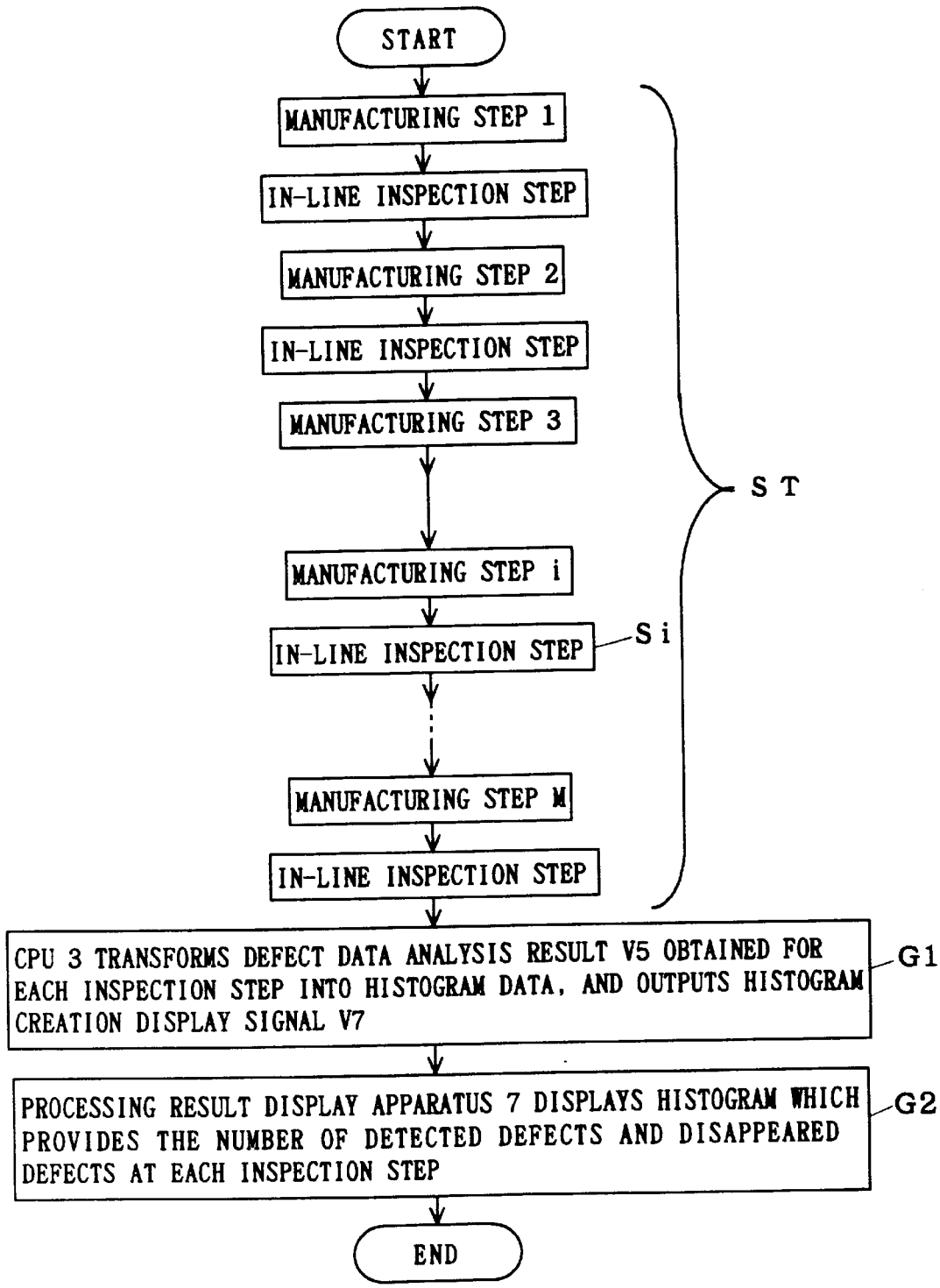
FIGS. 3 and 4 are flow charts showing the sequence of operations according to the first preferred embodiment.

First, FIG. 3 is a flow chart showing the flow of manufacturing steps which are performed in one line and in-line inspection steps (hereinafter "inspection steps" or "steps") which are performed following the respective manufacturing steps. In FIG. 3, it is assumed that the total number of the manufacturing steps which are performed in one line is M and therefore in-line inspection is performed M times in accordance with each manufacturing step. When the in-line inspection step following the manufacturing step M is completed, the apparatus 10 proceeds to creation of a histogram (Step G1 to Step G2) shown in FIG. 3.

Now, an optional manufacturing step will be referred to as "manufacturing step i" ($1 \leq i \leq M$) and an i-th in-line inspection step corresponding to the same will be referred to as "in-line inspection step Si" in the following. First, the sequence of operations at the in-line inspection step Si will be described with reference to the flow chart in FIG. 4.

Figure 5:
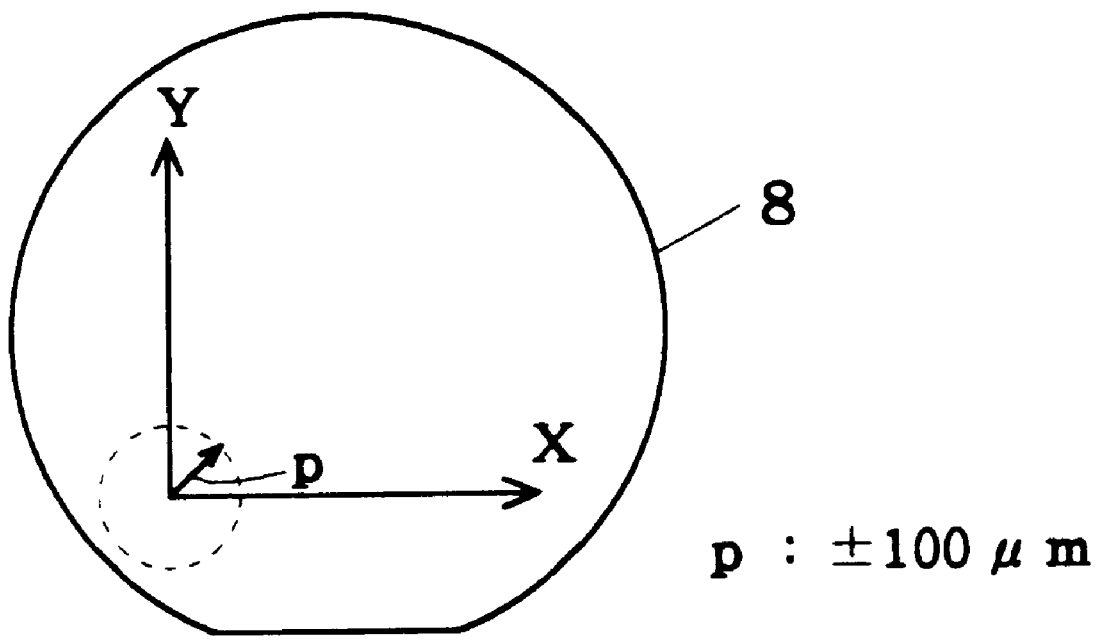
FIG. 5 is a diagram showing XY-coordinates within a wafer.

(Step S1) First, considering the size (surface area, etc.) of a detected defect and the stage accuracy, a user designates the overlapping accuracy p of overlaying XY-coordinate axes which are set on a wafer, and inputs the designated value as the input signal V3 on the input apparatus 4. The overlapping accuracy p is designated as about 100 µm, for example (see FIG. 5).

(Step S2) The inspection apparatus 1 performs semiconductor inspection on the wafer which is processed at the manufacturing step i, and stores coordinate data or the like regarding the detected defects as the data signals V1.

(Step S3) This step and subsequent steps are operation steps which are performed by the apparatus 10. First, the CPU 3 reads the data signals V1 from the inspection apparatus 1 and stores the signals V1 in a memory area of the defect data storage memory 2 which corresponds to the step i.

(Step S4) Next, the CPU 3 judges whether the processed data signals V5 regarding the step precedent to the step i, namely a step (i-1), have been stored in the processing result storage memory 6. In other words, since there is no precedent step when i=1, the CPU 3 judges as "NO," but judges as "YES" in other cases.

(Step S5) When judging "YES," the CPU 3 reads the processed data signals V5 regarding the step (i-1) from the memory 6, and stores the signals V5 in a corresponding memory area within the defect data storage memory 2.

(Step S6) The Step S6 is a main step. The CPU 3 reads a data signal V2 which consists of the data signals V1 and V5 from the memory 2. Based on the data signal V2, the CPU 3 performs comparison or referral of data regarding a non-disappeared (i.e., detected) defect and data regarding a disappeared defect. The flow charts in FIG. 6 and 7 show the details of this data analysis operation.

Figure 6:
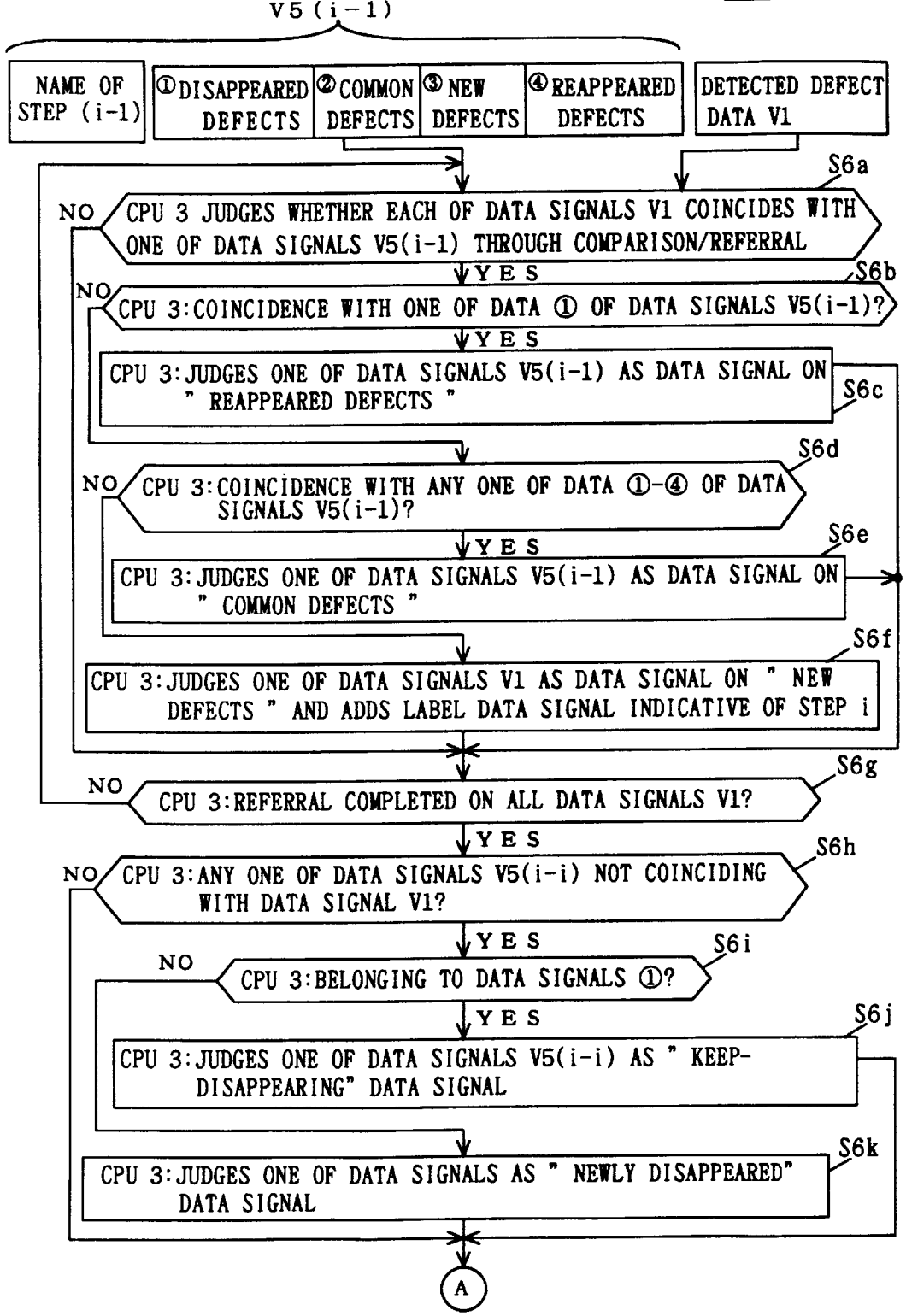
FIGS. 6 and 7 are flow charts showing the details of Step S6.
Figure 7:
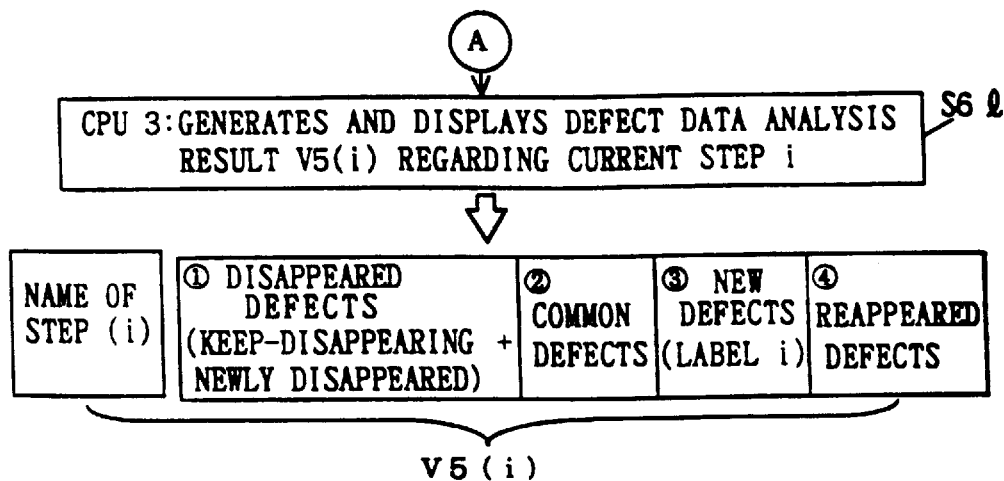

As shown in FIGS. 6 and 7, the data signal V2 as it is at this stage consists of a defect data analysis result V5(i-1) regarding the precedent step (i-1) and measurement data regarding the wafer after the step i, i.e., the detected defect data V1. Both the data V5(i-1) and V1 supply the positional coordinate data of the defects. The data V5(i-1) include data which supply the name of the step (i-1) and defect data which are classified into four types. That is, all defect data are classified into: ① positional coordinate data regarding defects which are detected as existing at the steps before the precedent step (i-1) but are detected as not existing at the precedent step (i-1) (i.e., disappeared defect data); ② positional coordinate data regarding defects which are detected as existing both at the steps before the precedent step and at the precedent step (i.e., common detect data); ③ positional coordinate data regarding defects which newly appear at the precedent step (i.e., new detect data); and ④ positional coordinate data regarding defects which disappear at the step immediately before the precedent step but are detected as existing once again at the precedent step (i.e., reappeared detect data). The data ② to the data ④ are non-disappeared detect data.

At the Step S6, the CPU 3 compares the data V5(i-1) with the data V1 to detect whether the both coordinate data coincide with each other.

First, when the CPU 3 judges as "YES," a defect which is detected at the step i is either "common defect" or "reappeared defect." On the other hand, when the CPU 3 judges as "NO," a defect which is detected at the step i can be judged as "new defect." However, in relation to data regarding a defect which is detected or judged as disappeared at the precedent step, it is necessary to determine whether this defect is "defect which newly disappeared (newly disappeared defect)" or "defect remains as disappeared at both the precedent step and this step (keep-disappearing defect)." To this end, the CPU 3 compares or performs referral on each detected defect data V1 with the data V5(i-1), in the following manner.

First, the CPU 3 compares one of the detected defect data V1 with each one of the data V5(i-1). Now, assuming that the CPU 3 judges that some data coincide with each other, the CPU 3 operates as follows. That is, when the one of the detected defect data V1 coincides with ① disappeared defect data, the CPU 3 judges that the detected defect is a reappeared defect, and stores the corresponding data V5(i-1) in an area assigned to ④ reappeared detect data within an i-th memory area (i.e., an area having a file which is named as the step i) of the processing result storage memory 6. When the one of the detected defect data V1 coincides with one of the three types of data of ② common detect data to ④ reappeared detect data, the CPU 3 judges that the detected defect is classified as "common defect," and stores the corresponding data V5(i-1) in an area assigned to ② common detect data within the i-th memory area of the memory 6. At this stage, the CPU 3 assigns a label data signal which is assigned to each data V5(i-1) directly to each data signal V5(i-1) and registers the same.

On the other hand, when the one of the detected defect data V1 does not coincide with any one of the data V5(i-1) at all, the CPU 3 judges that the detected defect is "new defect," and stores the data V1 in an area assigned to ③ new detect data within the i-th memory area of the memory 6. At this stage, the CPU 3 assigns a label data signal which supplies a label expressing the step i to the detected defect data signal V1. By means of such a label data signal, the CPU 3 can recognize that the new defect data is a data which is detected for the first time (i.e., newly detected) at this inspection step i.

The CPU 3 performs such comparison or referral as above on all detected defect data V1 (Steps S6a to S6g).

Following this, the CPU 3 performs the following comparison operation on data which are judged as not coinciding among the data V5(i-1) through the comparison or referral above (Steps S6h to S6k). That is, the CPU 3 judges whether each remaining data V5(i-1) judged as not coinciding belongs to ① disappeared defect data. If "YES," the CPU 3 classifies the data as "keep-disappearing defect data," but as "new defect data" if "NO." Hence, ① disappeared defect data judged as not coinciding are all "keep-disappearing defect data," and ② common detect data to ④ reappeared detect data judged as not coinciding are each "new defect data." The CPU 3 stores "keep-disappearing defect data" and "new defect data" classified into tow as such in the memory area with the step name i within the memory 6, as ① disappeared defect data for the step i.

Through Step S6 (i.e., Steps S6a to S6k) as described above, a defect data analysis result (V5(i)) is obtained regarding the step i which consists of ① disappeared defect data (with the precedent label assigned), ② common detect data (with the precedent label assigned), ③ new detect data (with a new label assigned), and ④ reappeared detect data (with the precedent label assigned). Of these data, on ③ new detect data, the number of defects which are detected for the first time at the step i is counted. The number of defects which are detected or which disappear from the step 1 through the precedent step (i-1) is found from data with a label corresponding to the respective steps among ② common detect data and ④ reappeared detect data and data which are recognized by a label corresponding to the respective steps among ① disappeared defect data. Hence, a defect data analysis result V5(1) regarding the step 1 is only ③ a new detect data, and a result V(2) for the step 2 consists of ③ new detect data with a label 2 assigned and data ①, ②, ④) with a label 1 assigned.

The result V5(i) is outputted to the processing result display apparatus 7 and displayed by the same (Step S6*l*).

(Step S7) The Step S7 is a step which is related only to first in-line inspection which is performed after the manufacturing step 1 is completed. The CPU 3 reads the data signals V1 from the memory 2 as the data signal V2, and assigns label data (i.e., label 1) which expresses a defect discovering step to each data of the data signal V2.

(Step 8) The CPU 3 stores the processed data signals V5 obtained by data analysis in the processing result storage memory 6 as the defect data analysis result V5(i) regarding the step i, and completes operating. This is the same as that at Step S6.

The step Si as above is repeatedly performed at a series of in-line inspection steps ST shown in FIG. 3.

Now, creation of a graph will be described with reference to FIG. 3. (Step G1) The CPU 3 reads the defect data analysis result V5(i) (1≦i≦M) regarding the respective inspection steps from the memory 6, and edits the data to correspond to predetermined histogram creation to thereby develop histogram creation data signals, and outputs the histogram creation data signals to the processing result display apparatus 7 as a histogram creation display signal V7.

A histogram is created in the following manner.

(1) Along a horizontal axis, the data are sorted from those regarding early inspection steps to those regarding later inspection steps (i.e., in a time-sequential order).

(2) The number of detected defects is measured along the positive side on the horizontal axis. At this stage, the CPU 3 stacks the detected defect data by the registered inspection step numbers, that is, by the inspection step numbers of when these defects are detected for the first time (i.e., by the same label values), thereby creating a histogram. In short, at each inspection step (i) on the horizontal axis, based on the labels (showing registered detection step numbers) allotted to the respective pieces of the data groups ②, ③ and ④ included in the defect data analysis result V5(i) which is obtained at the step (i), the CPU 3 edits such respective pieces of the data by groups of the detection step numbers, and calculates the number of the detected defects for each registered detection step number.

(3) The number of disappeared defects is measured along the negative side on the vertical axis. At this stage as well, the CPU 3 stacks the data regarding defects which disappeared at this step by the inspection step numbers of when these defects are newly detected, thereby creating a histogram. In short, at each inspection step (i) on the horizontal axis, based on the label values allotted to the respective pieces of the data group ① included in the result V5(i) which is obtained at the step (i), the CPU 3 classifies the respective pieces of the data into groups of the detection step numbers to which the data belong, and calculates the number of the disappeared defects for each registered detection step number.

(Step G2) Receiving the afore-mentioned signal V7, the processing result display apparatus 7 displays a histogram which shows the number of the detected defects and the number of the disappeared defects as they are classified by the respective new detection step numbers, for the respective inspection steps.

Figure 8:
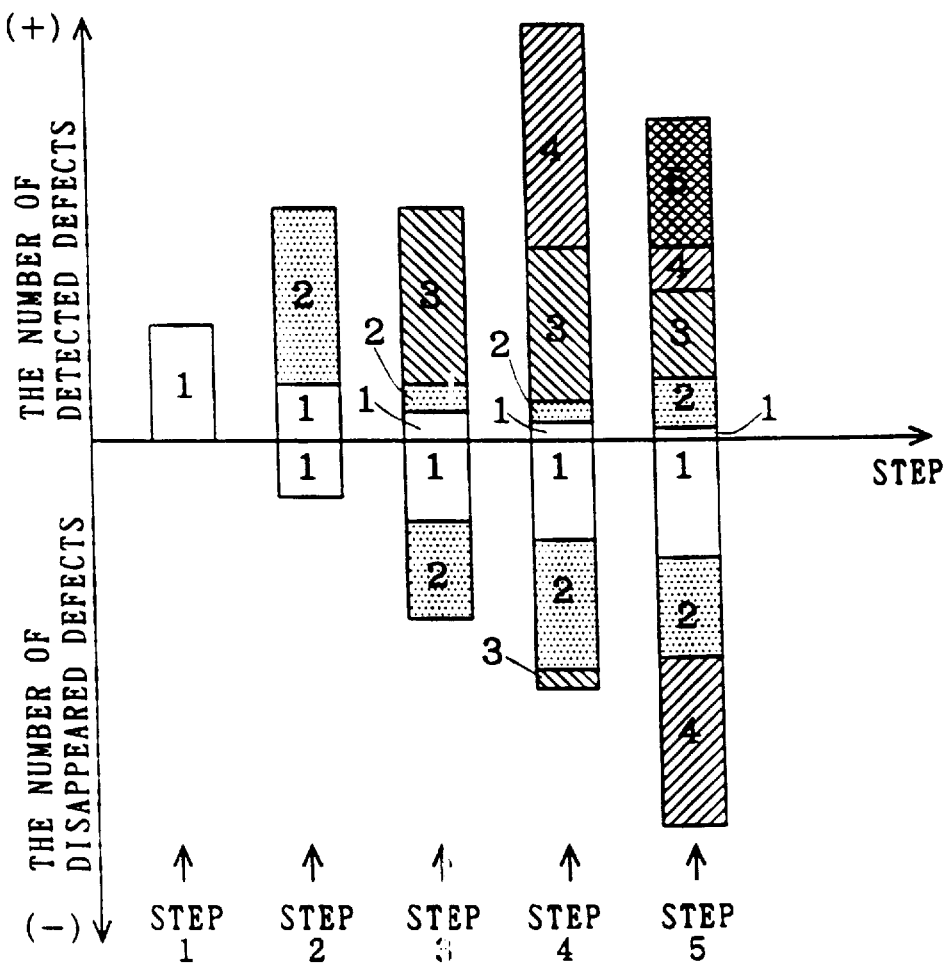
FIG. 8 is a diagram showing an example of an outputted display according to the first preferred embodiment.

FIG. 8 shows an example of such a histogram. The histogram in FIG. 8 is obtained by detecting detected defects at a plurality of inspection steps on the same wafer, overlapping the coordinates, and exhibiting the number of the newly detected defects and the number of the disappeared defects for the respective steps on one graph in the form of a histogram. The figures shown in the histogram denote the registered detection step numbers.

In this manner, the apparatus 10 displays not only newly created defects and remaining defects but also disappeared defects in one histogram. Hence, a user can read a lot more useful information than in the conventional technique on the histogram. That is, comparing the number of the detected defects with the number of the disappeared defects and studying the numbers, an ordinary user can always learn the total number of defects which are created or exist on a wafer. Moreover, the user can easily read information regarding the step numbers to which defects reappearing after once disappeared belong. This provides an ordinary user with a larger quantity of information which can be used as a criteria of judging whether there is a problem, whether there is a step with the problem and which step should be dealt with first to solve the problem than in the conventional technique, and therefore, even without expertise nor rich experiences, the user can judge more correctly with more certainty. If a step with a problem is correctly identified in this manner, it is possible to assume when defects are created. This makes it possible to solve the problem early, and hence, to greatly contribute to an improvement of the yield of manufacturing products and the quality during semiconductor manufacturing processes.

When referring to the defect data analysis result V5(i) which is displayed and outputted by the processing result display apparatus 7 at the end of each inspection step in addition to the histogram of FIG. 8, the user can judge even more properly.

Although the histogram above measures the number of defects which are defected and disappeared along the vertical axis, a ratio (%) of the number of the defects may be measured along the vertical axis. Since a physical quantity to be measured along the vertical axis has such a multiple definition, the apparatus 10 can be regarded as displaying a physical quantity which expresses the quantity of detected defects and the quantity of disappeared defects classified by the step numbers of when new defects are detected, along the positive side and the negative side of the vertical axis.

Second Preferred Embodiment

The second preferred embodiment aims to provide an ordinary user with a visual representation of information about a distribution of defects on a wafer during semiconductor manufacturing processes.

In the following, the second preferred embodiment will be described with reference to the associated drawings.

Figure 9:
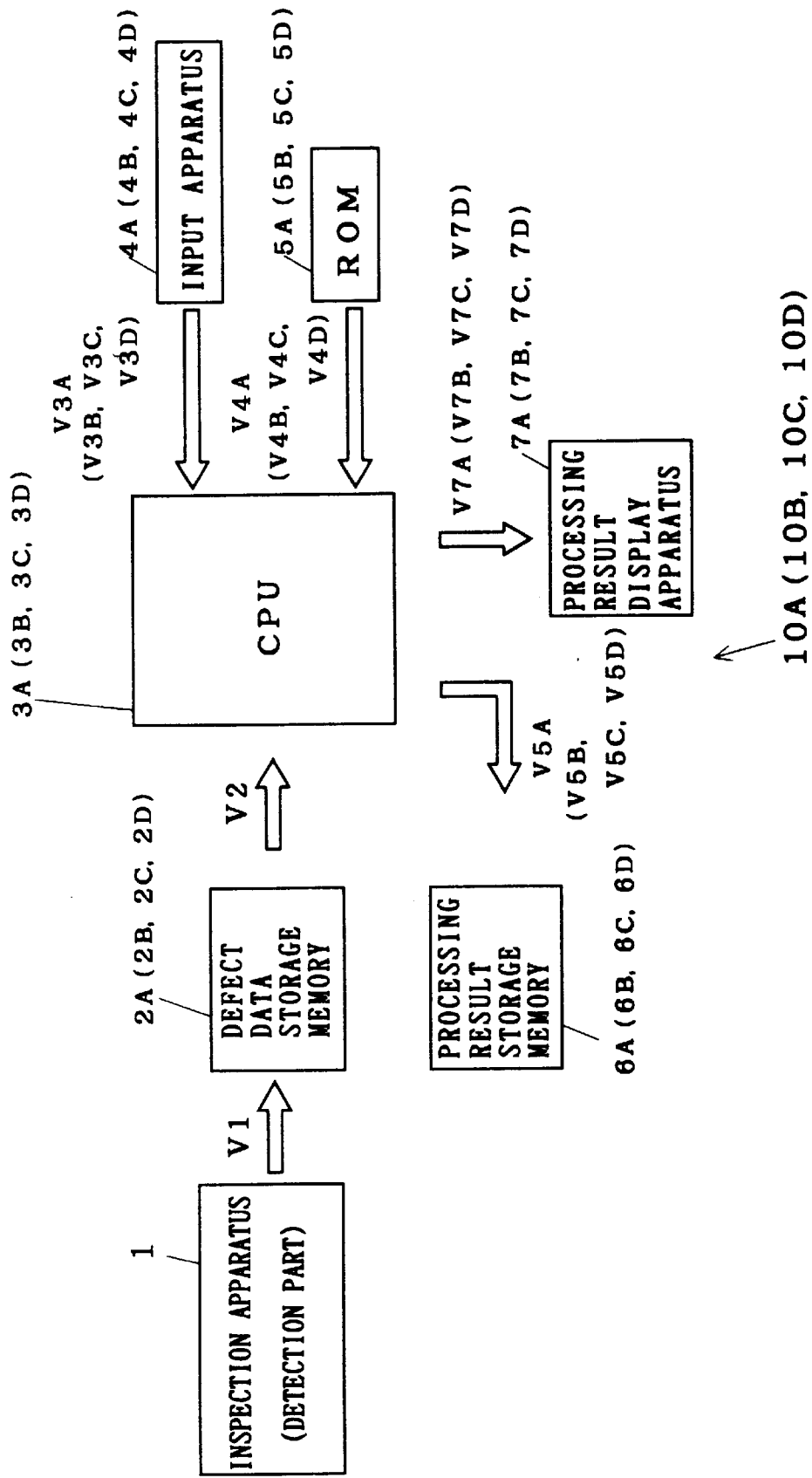
FIG. 9 is a block diagram showing the structure of an inspection data analyzing apparatus according to a second to a fifth preferred embodiments of the present invention.

FIG. 9 is a block diagram showing the structure of an inspection data analyzing apparatus 10A according to the second preferred embodiment. FIG. 9 will be commonly used for a third to a fifth preferred embodiments which will be described later. In FIG. 9, the alphabetic letters B, C and D which are included in the parenthetic reference symbols (such as 10B, 10C, 10D) denote corresponding elements which are used in the third to the fifth preferred embodiments.

As shown in FIG. 9, the apparatus 10A is comprised of a defect data storage memory 2A (first memory), a CPU 3A, an input apparatus 4A (e.g., keyboard), a ROM 5A (memory for storing a program operating the CPU 3A), a processing result storage memory 6A (second memory) and a processing result display apparatus 7A (e.g., a display apparatus and a printer). Operations and functions of the CPU 3A are principal operations and functions in this embodiment as well.

Figure 10:
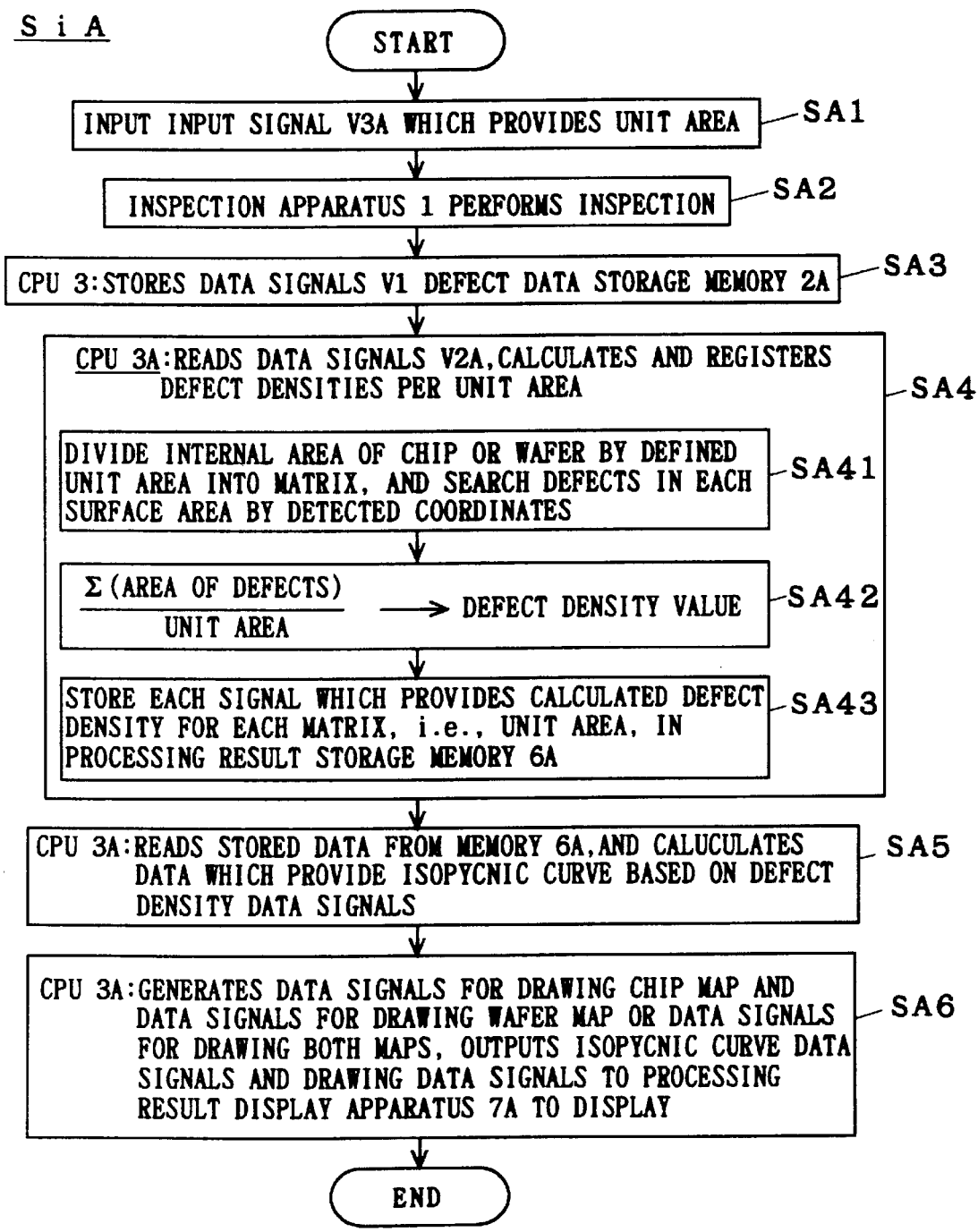
FIG. 10 is a flow chart showing the details of Step SiA in the second preferred embodiment.

FIG. 10 is a flow chart showing operations of the apparatus 10A (mainly, the CPU 3A) at the in-line inspection steps Si of FIG. 3. Now, operations at the respective in-line inspections at the steps ST will be described with reference to FIGS. 9 and 10.

(Step SA1) A user appropriately defines a unit area value, and inputs the defined value as the input signal V3.

(Step SA2) The inspection apparatus 1 itself inspects a semiconductor to obtain detected defect data (physical quantities such as a surface area and detected coordinates).

(Step SA3) The CPU 3A stores the data signals V1 fed to the inspection apparatus 1 in the defect data storage memory 2A (hereinafter simply "memory 2A").

(Step SA4) Based on each one of data signals V2A which are read, the CPU 3A calculates a defect density per unit area, and registers (i.e., stores) a calculated defect density for each matrix of the unit area.

In other words, the CPU 3A generates a data signal regarding a matrix which is defined by dividing the inner area of a chip by a region having the unit area, from a coordinate data signal regarding the chip and a signal which expresses the unit area. Based on the coordinate data signal regarding each matrix and the coordinate data signal regarding each of detected defects, the CPU 3A then searches for defects which are present within each matrix (Step SA41).

Following this, the CPU 3A calculates the defect density for each matrix, in accordance with a result of the search. A formula of calculation is defined as follows (Step SA42):

(Σ (surface area of defects))/(unit area)

The CPU 3A thereafter stores the signals each expressing each calculated defect density and the coordinate data signal regarding the corresponding matrix in the memory 6A (Step SA43).

(Step SA5) The CPU 3A reads stored data from the memory 6A, and calculates drawing data which provide a density profile curve based on the data which are read. The density profile curve corresponds to an isopycnic curve.

(Step SA6) The CPU 3A generates data signals for drawing a chip arrangement map (these data signals may be generated in advance), and outputs the chip arrangement map drawing data signals and the density profile curve drawing data signals as a display signal V7A. In response to the display signal V7A, the processing result display apparatus 7A provides a user with graphic information drawing the density profile curve on the chip arrangement. The chip arrangement map is shortly defined as a chip map.

Figure 11:
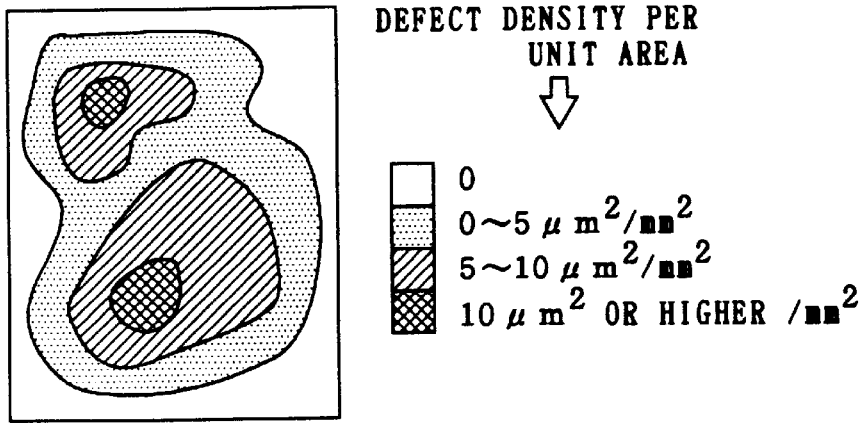
FIG. 11 is a diagram showing an example of an outputted display according to the second preferred embodiment.

FIG. 11 is a diagram showing an example of a density profile curve which expresses a distribution of defects which are detected at a certain inspection step i on one chip, which is calculated in the manner described above.

The density profile curve can be set in any range in accordance with the total number of detected defects, and may be set and displayed in any necessary range which is easy for a user to look at.

When the density profile curve regarding defects which are present on one chip is graphically displayed in this manner, the following advantage is obtained. That is, when there is a specific tendency regarding a manner in which defects are created on one chip and this tendency is present on other one chip, by means of graphic displaying as above, a user can easily learn that there is a design problem (regarding a pattern design, for example) and a process problem (e.g., margins for transfer). Conventional apparatuses do not have such a displaying function.

Modification of Second Preferred Embodiment (1) In a first modification, a map display is a defect distribution map of wafer display. In this case, the inner area of a wafer is divided by a unit area into a matrix at Step SA41 shown in FIG. 10, and the CPU 3A generates drawing data signals for a defect distribution map of wafer at Step SA6. The defect distribution map of wafer is also defined as a wafer map in short.

Figure 12:
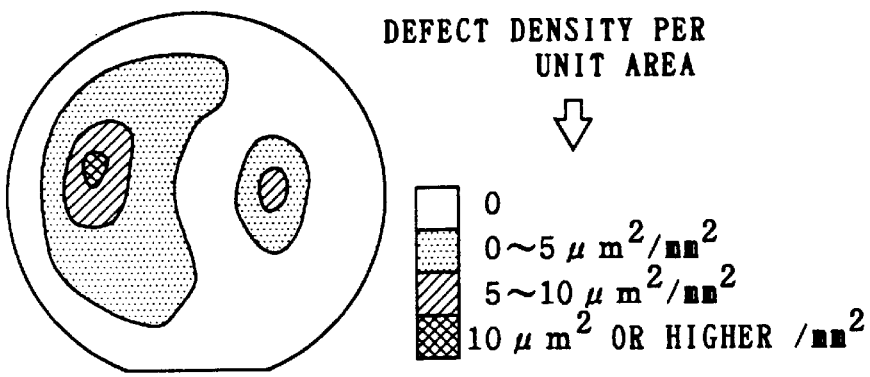
FIG. 12 is a diagram showing an example of an outputted display according to a first modification of the second preferred embodiment.

FIG. 12 shows an example of a display in this case.

An advantage of displaying the image of a density profile curve as it is overlapped on a screen which displays the entire wafer lies in the following point. That is, since the size of a semiconductor wafer is large, on the order of cm, while the size of a detected defect is very small, on the order of $\mu$m, when a defect density for each matrix which is defined by the unit area is to be displayed on a defect distribution map of wafer, the very operation of dividing into a fine matrix is under a limitation. Moreover, dividing into a fine matrix is not desirable since this makes it difficult for an ordinary user to properly grasp the meaning of the information. However, when a display is changed to the density profile curve display, it is possible to properly provide an ordinary user with information which is essential for judgement while solving such a problem. This is true with a chip arrangement map display as that used in the second preferred embodiment. Further, the processing and the display as those shown in FIG. 12 make it possible to obtain detected defect data at a high certainty and accuracy, even when there is no pattern or when a film has been just formed or when only a wet process is complete.

(2) In a second modification, the chip arrangement map is displayed as it is overlapped on the defect distribution map of wafer and a density profile curve is further overlapped on these maps.

In this case, the CPU 3A divides each chip which is included in a wafer by a unit area into a matrix at Step SA4 shown in FIG. 10, and generates drawing data signals for drawing both the chip arrangement map and the defect distribution map of wafer as they are overlapped each other at Step SA6.

Figure 13:
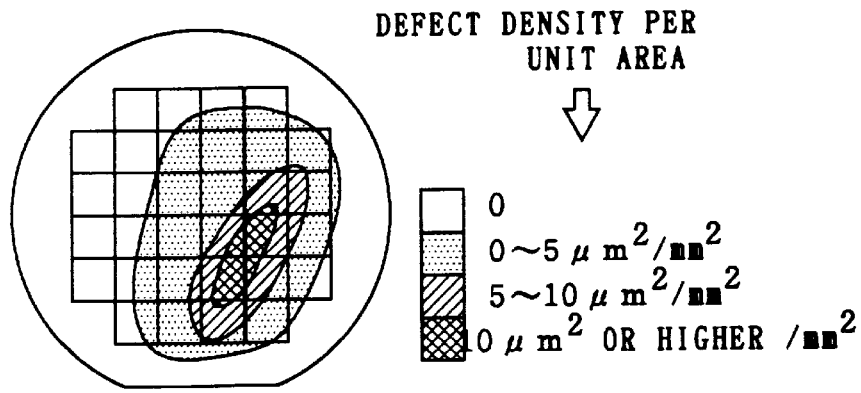
FIG. 13 is a diagram showing an example of an outputted display according to a second modification of the second preferred embodiment.

FIG. 13 shows an example of a display by the processing result display apparatus 7A through such processing according to this modification.

An advantage of this modification lies in that it is possible for a user to visually recognize not only a relationship with the entire wafer but also a distribution of defects which are present on each chip at the same time. Hence, when an etching ability changes locally, the user can learn a tendency that etch residues are left locally on the wafer and other tendencies without fail.

As described above, according to the second preferred embodiment and the first and the second modifications of the second preferred embodiment, since a condition in which defects and foreign matters are present and the physical quantities of the defects and the foreign matters are visually displayed, it is possible to provide a user with more information at the same time so that the user can learn whether there is a problem and a clue for tracking a cause of the problem at an early stage. As a result, the apparatus 10A can greatly contribute to an improvement in the yield in a semiconductor manufacturing program.

Third Preferred Embodiment

In a third preferred embodiment, detected defects are classified by the size and displayed on a map considering the sizes of the detected defects. Now, this will be described in the following, with reference to FIG. 9.

Figure 14:
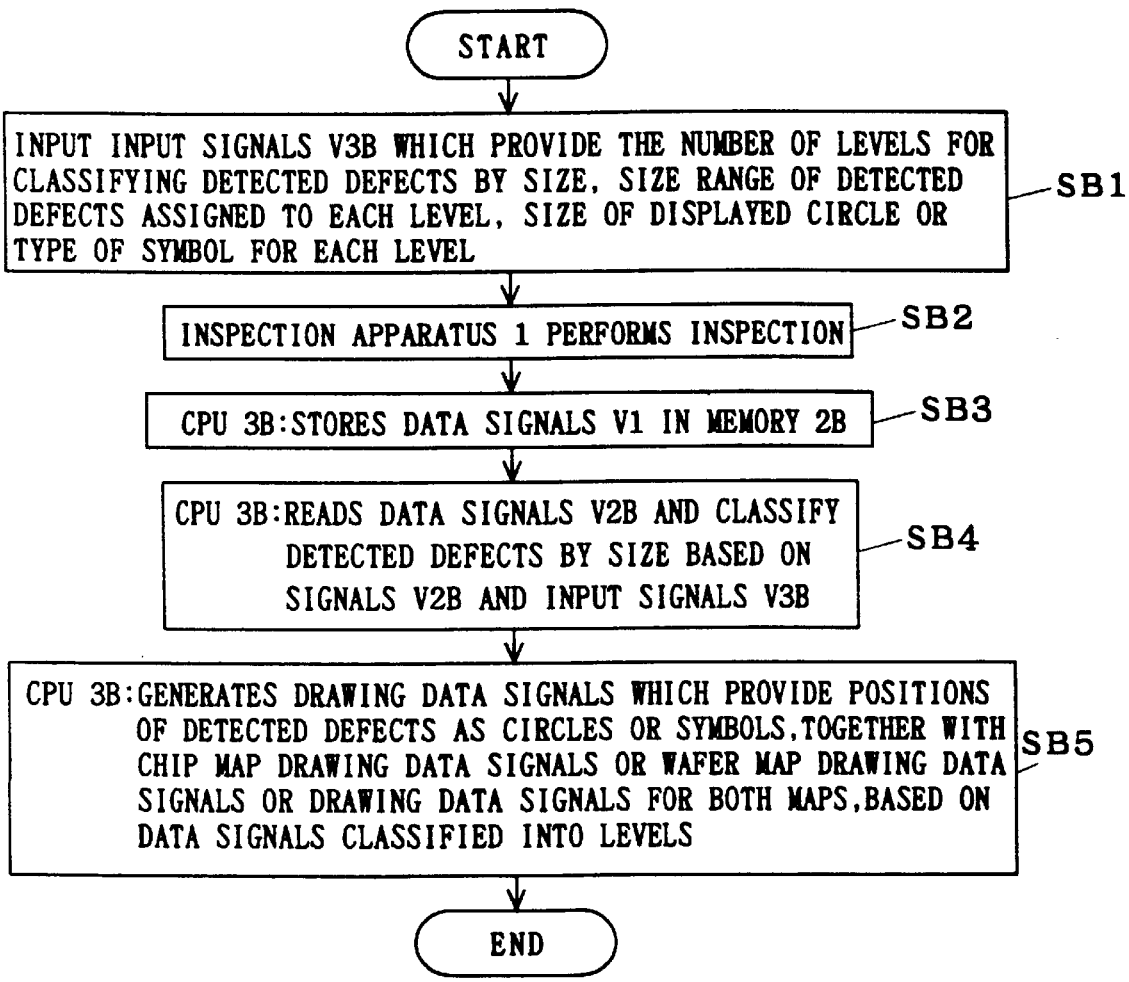
FIG. 14 is a flow chart showing the details of Step SiB in the third preferred embodiment.

FIG. 14 is a flow chart showing operations of an inspection data analyzing apparatus 10B at steps SiB which correspond to the in-line inspection steps Si of FIG. 3.

At Step SB1, using an input apparatus 4A, a user inputs input signals V3B which designate the number of classification levels for classifying detected defects by the size, a detected defect size range assigned to each classification level, and the sizes of displayed circles or the type of symbols (hereinafter collectively referred to as "displayed mark") at the respective levels.

Step SB2 and Step SB3 correspond to Step SA2 and Step SA3, respectively.

At Step SB4, a CPU 3B classifies detected defects by their size, based on a data signals V2B which are read and each input signal V3B. At Step SB5, the CPU 3B generates drawing data signals which express the position of each detected defect as a displayed mark (e.g., circle) or a specific symbol mark (of a predetermined form), in accordance with a positional coordinate data signal regarding each detected defect and a level classified data signal which is obtained on each detected defect. The CPU 3B also generates the chip arrangement map drawing data signals. Hence, the CPU 3B instructs a processing result display apparatus 7B to display an image in which the detected defects are drawn as graphics or symbols of specific sizes which are allotted to the respective classification levels for the respective detected defects, on a chip arrangement map image.

Figure 15:
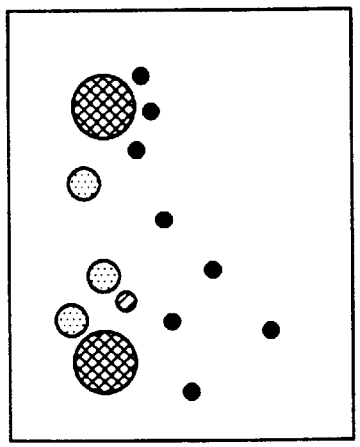
FIG. 15 is a diagram showing an example of an outputted display according to the third preferred embodiment.

FIG. 15 shows an example of a display in which defects which are detected within one chip are displayed as circles of sizes which are allotted to the respective classification levels to which the defects belong (the center of each circle is the position of each detected defect). In FIG. 15, the defect sizes are classified into four, and circles of predetermined radii are displayed for the respective classifications.

This creates a similar effect to that obtained in the second preferred embodiment. The third preferred embodiment is particularly advantageous in the following point. That is, when the number of defects is small, a display by means of a density profile curve as in the second preferred embodiment is inadvertently difficult for a user to understand. Hence, in such a case, a display showing a distribution of detected defects only by the sizes as that in the third preferred embodiment is preferably easier for a user.

Figure 16:
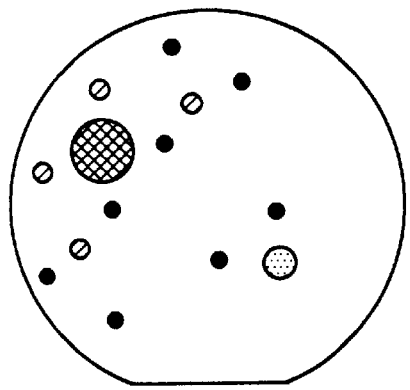
FIG. 16 is a diagram showing an example of an outputted display according to a first modification of the third preferred embodiment.

Modification of Third Preferred Embodiment (1) In a first modification, a display covering one chip is changed to a display covering the entire wafer. In this case, the CPU 3B generates defect distribution map of wafer drawing data at Step SB5 of FIG. 14. FIG. 16 shows an example of such a display.

This modification creates the effect which is obtained by the first modification of the second preferred embodiment.

Figure 17:
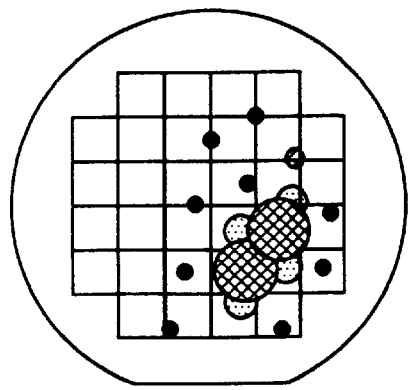
FIG. 17 is a diagram showing an example of an outputted display according to a second modification of the third preferred embodiment.

(2) In a second modification, images of detected defects as they are classified by size are displayed over the overlapped images of the defect distribution map of wafer and the chip arrangement. FIG. 17 shows an example of a display in which the defect sizes are classified into four and the respective classification levels are distinguished by circle marks having different radii from each other.

This modification creates the effect which is obtained by the second modification of the second preferred embodiment.

Fourth Preferred Embodiment

A fourth preferred embodiment as well requires to follow procedures for making it possible for a user to visually recognize a distribution of defects which are detected by in-line inspection. The fourth preferred embodiment is characterized in that the maximum density of detected defects is calculated directly for each chip. Now, the fourth preferred embodiment will be described with reference to the associated drawings.

Figure 18:
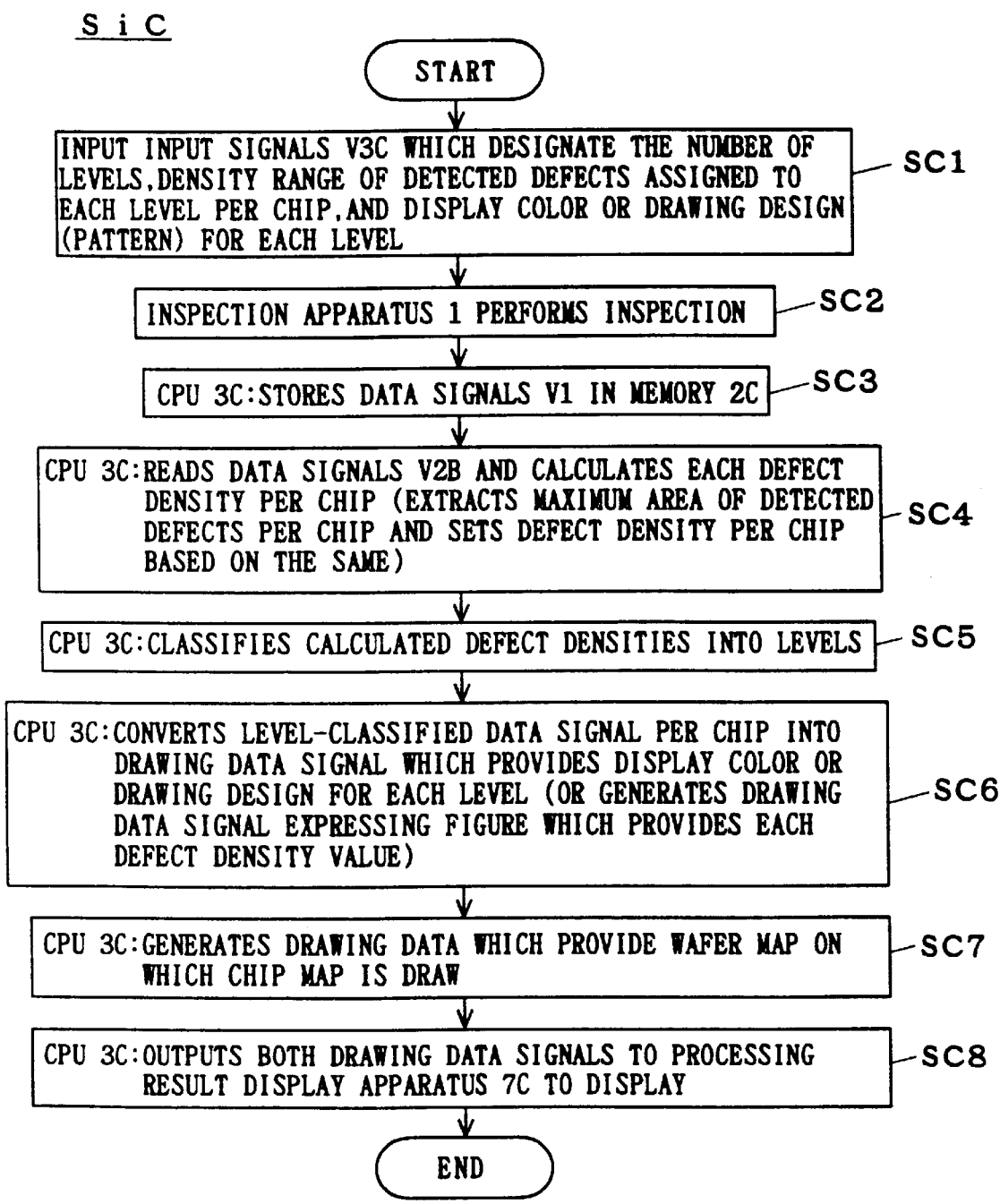
FIG. 18 is a flow chart showing the details of Step SiC in the fourth preferred embodiment.

FIG. 18 is a flow chart showing operations of an inspection data analyzing apparatus 10C (FIG. 19), principally, at the in-line inspection steps Si of FIG. 3.

(Step SC1) Based on a user definition, an input apparatus 4C provides a CPU 3C with input signals V3C which designate the number of classification levels, a range of the maximum density of detected defects in the unit of chips assigned to each classification level, and a display color or a drawing design (pattern) for each classification level (hereinafter collectively referred to as "display form").

(Step SC2 to Step SC3) These steps are similar to Step SA2 to Step SA3 described earlier.

(Step SC4) The CPU 3C calculates each defect density per chip based on data signals V2C which are read. In other words, the CPU 3C extracts data regarding detected defects which are present within each chip based on the positional coordinate data of the detected defects and surface value data (physical quantity data) regarding the same which are expressed by the respective data signals V2C, extracts maximum surface value data from the surface value data regarding the detected defects which belong to the chip for each one of the chips, and divides the maximum surface value data by the surface are data regarding the chip for each chip. The CPU 3C sets each resultant data value as the data regarding the detected defects on the corresponding chip. The data on the defect density on each chip serves as precious information for a user to learn whether each chip is damaged.

(Step SC5) Based on information regarding the number of classification levels and the range of the defect density values per chip covered by each classification level which are expressed by the input signal V3C and based on each calculated defect density data signal per chip, the CPU 3C judges to which classification level each chip is classified, and obtains a level judging data signal for each chip.

(Step SC6) Based on a display color or pattern information expressed by the input signals V3C and the level judging data signal obtained for each chip, the CPU 3C generates drawing data signals which define with which display color or which pattern each chip is displayed.

(Step SC7 to Step SC8) The CPU 3C generates map drawing data signals for drawing a chip arrangement map over a defect distribution map of wafer (these data signals may be generated in advance), and provides a processing result display apparatus 7C with the both drawing data signals as a drawing data signal V7C which is to be supplied to a display apparatus.

Figure 19:
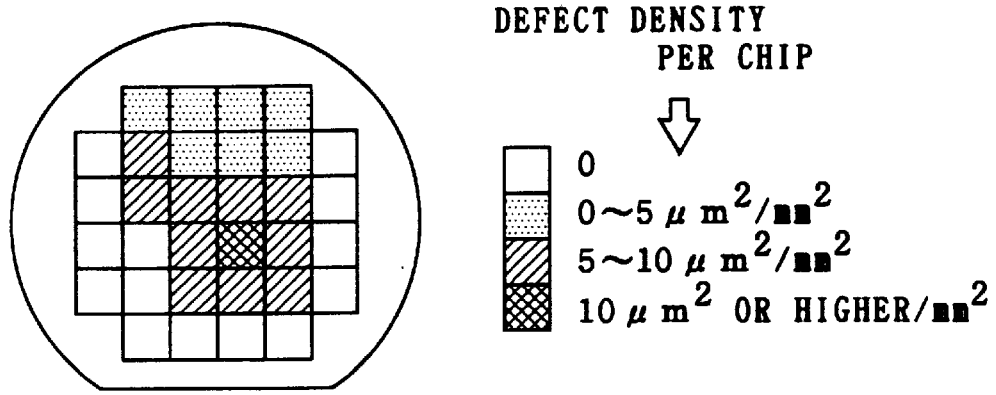
FIG. 19 is a diagram showing an example of an outputted display according to the fourth preferred embodiment.

FIG. 19 shows an example of a display in which data are processed and displayed with the defect density classified into four levels and chips belonging to the respective levels hatched or illustrated as predetermined patterns.

Through such processing and displaying, the effect which is obtained by the second preferred embodiment is created. To be particularly noted, it is easy for a user to judge whether each chip is alive or dead. Thus, the apparatus 10C properly provides information which is necessary for a user to learn the yield, in an easy-to-follow form.

Modification of Fourth Preferred Embodiment

Instead of presenting defect density information regarding each chip in the form of a colored display or the like as described above, the defect density value regarding each chip may be displayed directly on a screen. In this case, Step SC1 and Step SC5 shown in FIG. 18 are not necessary. The CPU 3C generates the drawing data signals which express figures denoting the values of the respective defect densities at Step SC6.

Figure 20:
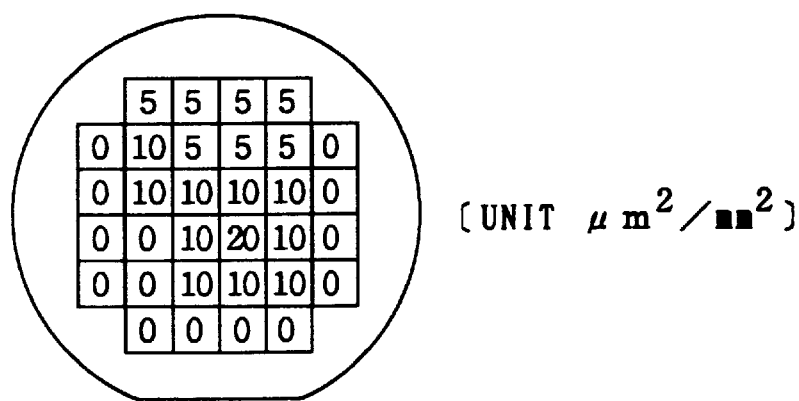
FIG. 20 is a diagram showing an example of an outputted display according to a modification of the fourth preferred embodiment.

FIG. 20 shows an example of such a display.

This modification creates the same effect as that obtained in the fourth preferred embodiment.

Fifth Preferred Embodiment

A fifth preferred embodiment provides a user with information regarding a critical ratio regarding each chip at each step, thereby visualizing whether there is a problem and contributing to an improvement in the yield and the quality. The critical defect ratio per chip is also referred to as "killer ratio".

A critical defect ratio is calculated based on a user definition. Calculation can be easily performed on regular software for numerical calculation. For example, a user definition may be such a definition setting the critical defect ratio as 10% when five or more defects larger than 1 $\mu$m are detected, 50% when ten or more defects of 0.5 to 1 $\mu$m are detected, but as 25% when thirty or more defects smaller than 0.5 $\mu$m are detected. Alternatively, the critical defect ratio may be defined based on a defect density per unit area. The latter case will be described in the following.

Figure 21:
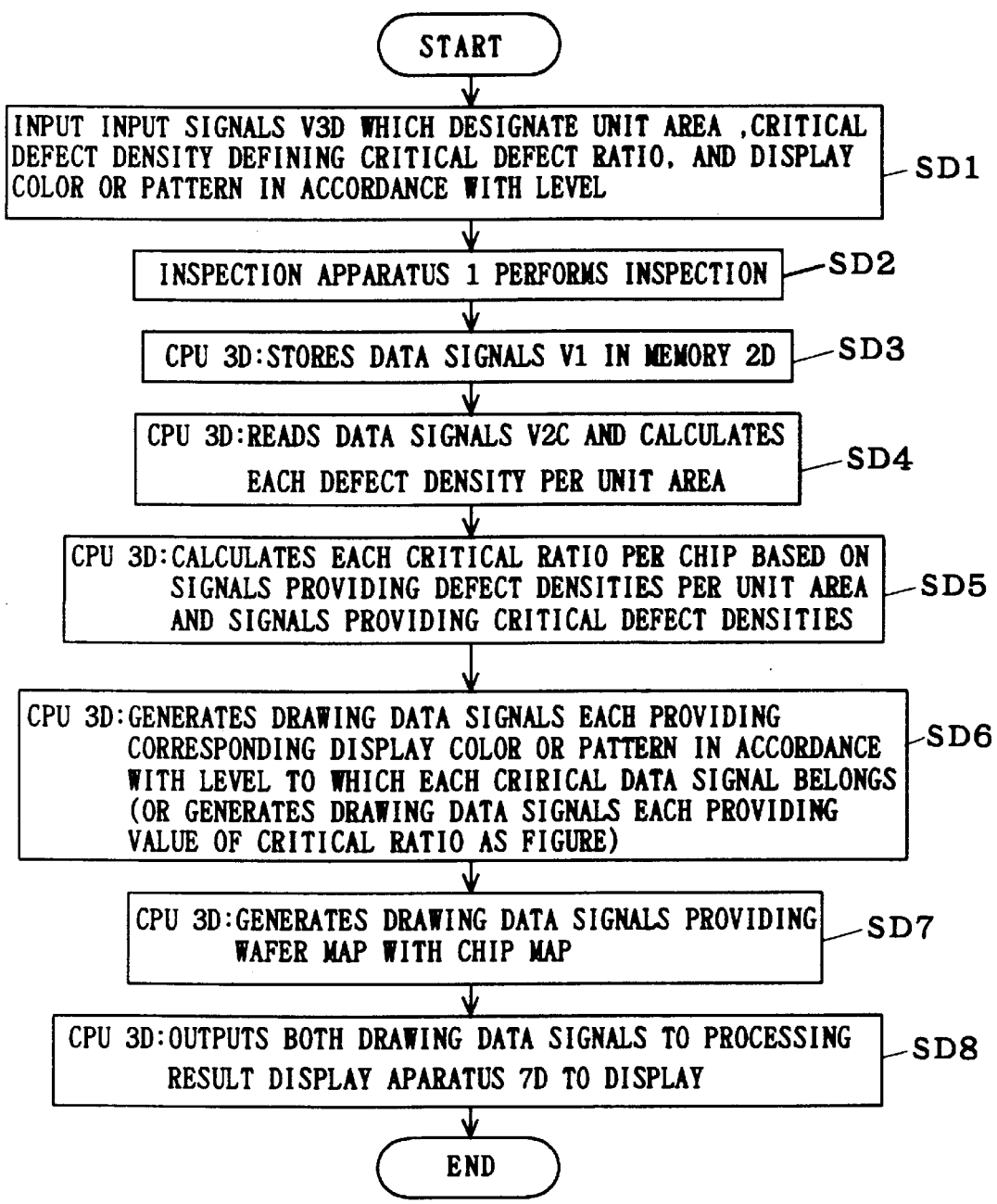
FIG. 21 is a flow chart showing the details of Step SiD in the fifth preferred embodiment.

FIG. 21 is a flow chart for describing steps SiD which correspond to the steps Si of FIG. 3. This flow chart will be described with reference to FIG. 9.

(Step SD1) Based on a user definition, an input apparatus 4D provides a CPU 3D with input signals V3D which designate the unit surface area, a critical defect density which defines the critical defect ratio, and a display color or a pattern (i.e., display form) corresponding to each level of the critical defect ratio.

The critical defect density is defined, for instance, to set the critical defect ratio as 50% when the maximum value of the defect density per unit area within a chip exceeds 10 $\mu m^2/mm^2$, 25% when the maximum value is 5 to 10 $\mu m^2/mm^2$, 10% when the maximum value is smaller than that, and 0% when the maximum value is 0 $\mu m^2/mm^2$.

The critical defect ratio is displayed in % and classified into the levels above since an absolute value only provides information which serves as a predicted value or a guideline value (and hence, inspection of an electrical characteristic is eventually needed) and a user only has to understand the critical defect ratio only as a tendency.

(Step SD2 to Step SD4) After the inspection apparatus 1 performs inspection, the CPU 3D stores the data signals V1 in a memory 2C, and reads the same as data signals V2D to thereby calculate each defect density per unit area.

(Step SD5) Based on data signals which express the defect densities per unit area and data signals which express the critical defect densities, the CPU 3D calculates the critical ratio on each chip. That is, under the definition above on the critical defect density, the CPU 3D extracts the maximum value from defect density data on each unit area region of a chip for each one of chips, and judges whether the maximum value exceeds 10 $\mu m^2/mm^2$. Judging "YES," the CPU 3D sets the critical defect ratio of the chip as 50%. Judging "NO," the CPU 3D judges whether the extracted value is within the range from 5 to 10 $\mu m^2/mm^2$, and sets the critical defect ratio as 25% if "YES" but as 10% if "NO" and the extracted value is not 0.

(Step SD6 to Step SD8) The CPU 3D generates a drawing data signal which expresses a predetermined display color or pattern in accordance with a critical defect ratio data signal for each chip and further generates map drawing data signals which express a chip arrangement map and a defect distribution map of wafer. The CPU 3D then outputs the both drawing data signals to a processing result display apparatus 7D as a graphic signal.

Figure 22:
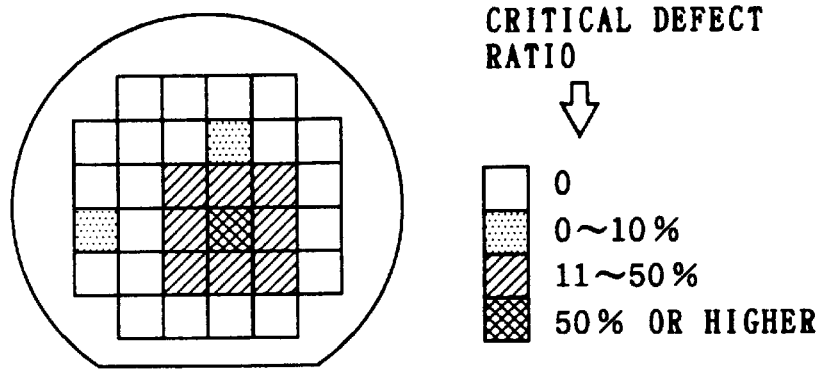
FIG. 22 is a diagram showing an example of an outputted display according to the fifth preferred embodiment.

FIG. 22 shows an example of a graphic display which displays a calculated result of the critical defect ratio for each chip in the form of a pattern.

Figure 23:
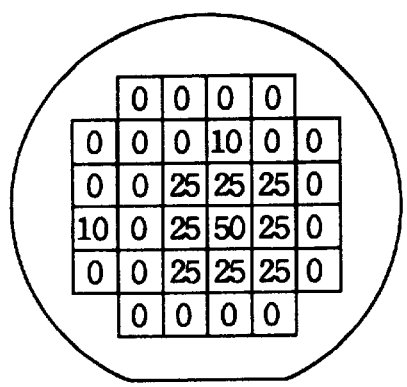
FIG. 23 is a diagram showing an example of an outputted display according to a modification of the fifth preferred embodiment.
Figure 24:
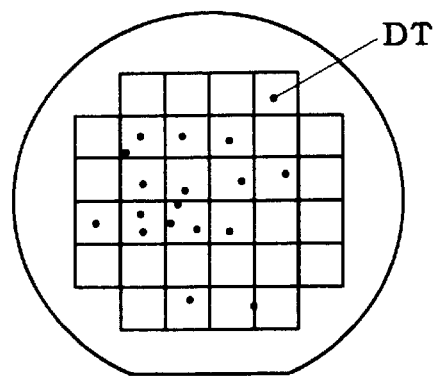

A modification is possible in which a figure denoting the critical defect ratio for each chip is written directly on a map. FIG. 23 shows an example of such a display.

Such data analysis and displaying as above makes it easy for a user to assume the yield on each wafer. The apparatus 10D provides information for judgement as a visual presentation to a user so that the user can understand the condition of each wafer. Hence, the user can quickly and objectively judge whether a wafer or a lot is alive or dead. This advantage leads to another advantage that the user does not fail to notice an important problem. These advantages make it possible even for a person who does not understand a relationship between semiconductor processes and inspection data at a deep level to judge whether a wafer is alive or dead. As a result, the apparatus 10D can greatly contribute to an improvement in the yield in a semiconductor manufacturing program.

Figure 4:
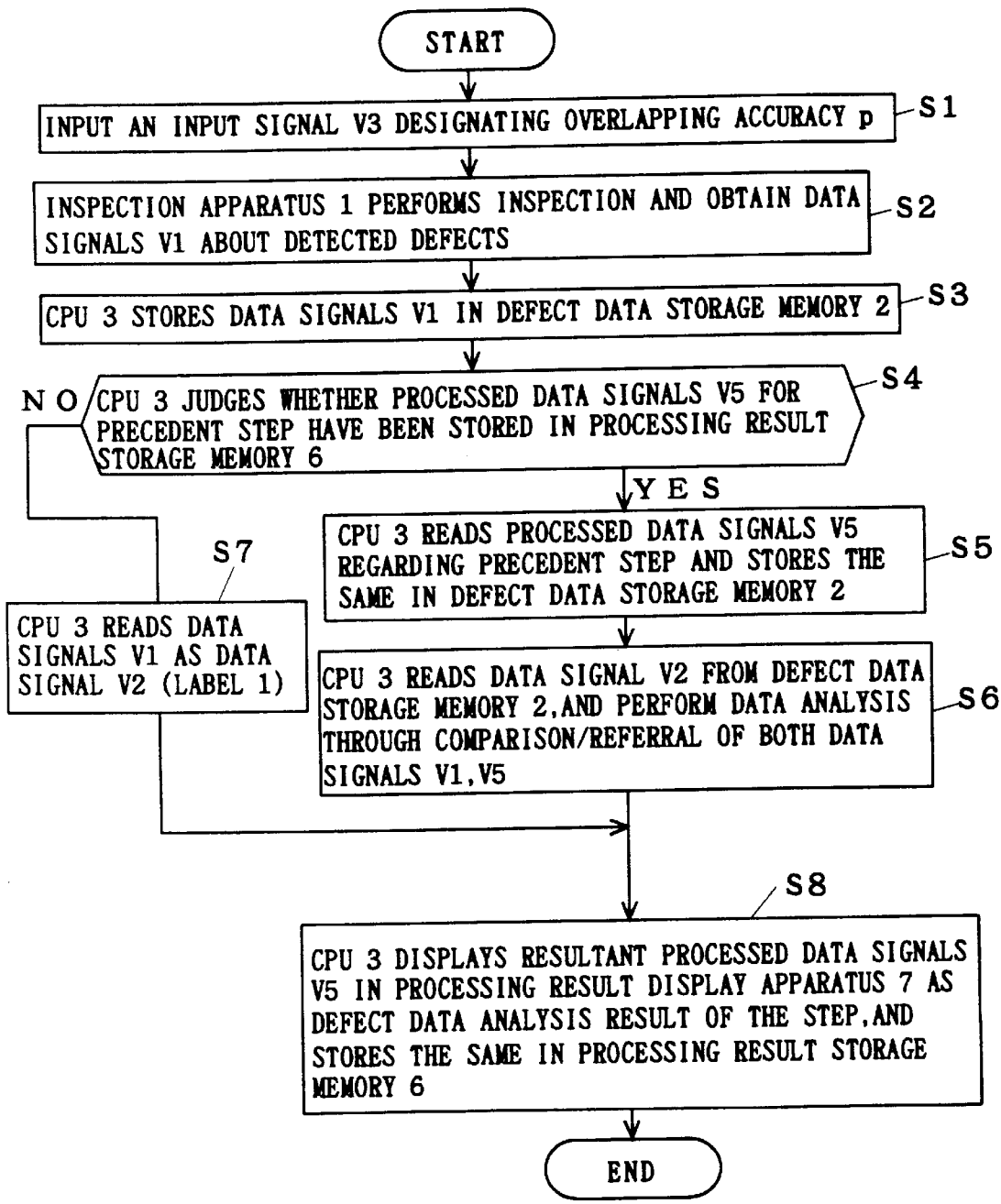

Practical Application (1) As a practical application of the first preferred embodiment, after Step S6 shown in FIG. 4, the CPU 3 may perform both data processing and display of associated outputs which are performed in either one of the second to the fifth preferred embodiments (Step SA4 to Step SA6, Step SB4 to Step SB5, Step SC4 to Step SC8, Step SD5 to Step SD8) on the data signals regarding newly detected defects at the step i. In this case, it is necessary to supply a user definition value such as a unit surface area in advance as an input signal.

Instead of processing and displaying the data regarding newly detected defects, the CPU 3 may perform data processing and displaying according to either one of the second to the fifth preferred embodiments on data regarding disappeared defect data, common detect data, reappeared detect data, etc.

Further, in addition to data processing and displaying performed in the first preferred embodiment, the CPU 3 may perform data processing and displaying according to either one of the second to the fifth preferred embodiments on a specified one step or a plurality of specified steps, instead of on each step.

These practical applications create both the effect obtained in the first preferred embodiment and the same effects as those obtained in the second to the fifth preferred embodiments.

(2) While the foregoing has described the second to the fifth preferred embodiments as requiring to calculate the density of detected defects from the surface area data of the detected defects, instead of this, the density of the detected defects may be determined by the number of detected defects which are present per unit area or chip surface area.

While the invention has been described in detail, the foregoing description is in all aspects illustrative and not restrictive. It is understood that numerous other modifications and variations can be devised without departing from the scope of the invention.

We claim:

1. An inspection data analyzing apparatus for in-line inspection, which analyzes each one of detected defect data signals which are obtained on a semiconductor wafer and stored to generate stored detected defect data signals for each one of inspection steps which follows a corresponding optional step of semiconductor manufacturing steps, comprising:

(a) means for generating defect data analysis processing result signals which are related to a first one of said inspection steps, based on said stored detected defect data signals at said first one of said inspection steps, and generating subsequent defect data analysis processing result signals which are related to subsequent inspection steps, respectively, based on stored detected defect data signals at said subsequent inspection steps, respectively; and (b) means for comparing said stored detected defect data signals at any of said inspection steps after said first inspection step with defect data analysis processing result signals which are related to a precedent one of said inspection steps which is immediately precedent to a current one of said inspection steps, to thereby generate defect data analysis processing result signals regarding said current one of said inspection steps;

wherein said defect data analysis processing result signals of said current one of said inspection steps comprise disappeared defect data signals and non-disappeared defect data signals, said disappeared defect data signals provide data which are related to at least a disappeared defect which is judged as disappeared if said disappeared defect is detected at any one of said inspection steps which is prior to said current one of said inspection steps but is not detected at said current one of said inspection steps, and said non-disappeared defect data signals provide data which are related to at least a non-disappeared defect which can be judged as non-disappeared since said non-disappeared defect is detected at said current one of said inspection steps.

2. The inspection data analyzing apparatus for in-line inspection according to claim 1, wherein said generating means (a) comprises:

(a-1) means for assigning a data signal which expresses a first step of said semiconductor manufacturing steps to each one of said detected defect data signals;

said comparing and generating means (b) comprises:

(b-1) means for performing said comparison to thereby judge whether a defect which is expressed by each one of said defect data analysis processing result signals regarding said precedent one of said inspection steps becomes said disappeared defect or said non-disappeared defect, and whether said defect which is expressed by each one of said detected defect data analysis processing result signals is a new defect which is detected for the first time at said current one of said inspection steps or not, for newly assigning a label data signal which expresses a step number for one of said semiconductor manufacturing steps which corresponds to said current one of said inspection steps to a corresponding one of said detected defect data signals, to thereby set said corresponding one of said detected defect data signals to which said label data signal is assigned as one of said non-disappeared defect data signals when judging that said defect is said new defect; and for assigning a corresponding previous label data signal which has already been assigned at said precedent one of said inspection steps to each one of said defect data analysis processing result signals regarding said precedent one of said inspection steps, to thereby set said each one of defect data analysis processing result signals as one of said disappeared defect data signals when judging that said defect is said disappeared defect and said set said each one of said defect data analysis processing result signals as one of said non-disappeared defect data signals when judging that said defect is said non-disappeared defect, whereby creating said defect data analysis processing result signals regarding said current one of said inspection steps.

3. The inspection data analyzing apparatus for in-line inspection according to claim 2, wherein said non-disappeared defect data signals comprise common defect data signals, new defect data signals, and reappeared defect data signals, said common defect data signals provide data about said defect which is detected at both said current one of said inspection steps and said precedent one of said inspection steps, said new defect data signals provide data about said new defect, said reappeared defect data signals provide data about said defect which is said disappeared defect at said precedent one of said inspection steps but is detected at said current one of said inspection steps, and said (b-1) means for performing said comparison includes (b-1-1) means for comparing said each one of said detected defect data signals with said defect data analysis processing result signals regarding said precedent one of said inspection steps, for setting said one of said disappeared defect data signals as one of said reappeared defect data signals of said defect data analysis processing result signals regarding said current one of said inspection steps when said one of said detected defect data signals coincides with one of said disappeared defect data signals, for setting said one of said non-disappeared defect data signals as one of said common defect data signals of said defect data analysis processing result signals regarding said current one of said inspection steps when said one of said detected defect data signals coincides with one of said non-disappeared defect data signals, and for setting said one of said detected defect data signals to which said label data signal is assigned as one of said new defect data signals of said defect data analysis processing result signals regarding said current one of said inspection steps when said one of said detected defect data signals does not coincide with any one of said defect data analysis processing result signals regarding said precedent one of said inspection steps; and (b-1-2) means for setting each one of both said disappeared defect data signals and said non-disappeared defect data signals which are included in said defect data analysis processing result signals regarding said precedent one of said inspection steps which do not coincide with any one of said detected defect data signals as said disappeared defect data signals of said defect data analysis processing result signals regarding said current one of said inspection steps.

4. The inspection data analyzing apparatus for in-line inspection according to claim 1, further comprising:
(c) means for generating data signals which provide physical quantities which express quantities of detected defects and quantities of disappeared defects for each one of said inspection steps after two or more steps of said inspection steps are complete, based on comparing said defect data analysis processing result signals with said stored defect data signals for each one of said inspection steps in said comparing and generating means (b).

5. The inspection data analyzing apparatus for in-line inspection according to claim 4, further comprising:
(d) means for displaying said physical quantities in a form of a histogram, in accordance with said data signals outputted by said data signals generating means (c).

6. The inspection data analyzing apparatus for in-line inspection according to claim 1, wherein said generating means (a) generates said defect data analysis processing result signals for each one of said inspection steps.

7. An inspection data analyzing apparatus for in-line inspection which analyzes detected defect data signals which are obtained on a semiconductor wafer by an inspection apparatus after any one of semiconductor manufacturing steps is complete, comprising:
(a) means for receiving said detected defect data signals and for obtaining data signals which provide defect densities per predetermined unit area, from said detected defect data signals;
(b) means for calculating and generating first drawing data signals based on said data signals which are obtained by said data signals receiving and obtaining means (a);
(c) means for generating second drawing data signals which provide a chip arrangement; and
(d) means for graphically displaying said first drawing data signals obtained by said calculating means (b), and said chip arrangement based on said second drawing data signals generated by said generating means (c).

8. The inspection data analyzing apparatus for in-line inspection according to claim 7, wherein
said generating means (c) further generates third drawing data signals which provide a defect distribution map of said semiconductor wafer, and
said displaying means (d) further graphically displays said defect distribution map of said semiconductor wafer generated by said generating means (c).

9. The inspection data analyzing apparatus for in-line inspection according to claim 7, wherein
the graphic display of said displaying means (d) is provided by a density profile curve.

10. An inspection data analyzing apparatus for in-line inspection which analyzes detected defect data signals which are obtained on a semiconductor wafer including at least one chip by an inspection apparatus, comprising:
(a) means for receiving said detected defect data signals and for classifying said detected defect data signals in accordance with a plurality of classification levels each assigned to a defect size range, to thereby generate drawing data signals which express positions of detected defects and provide different display forms based on said plurality of classification levels to which said classified detected defect data signals belong; and
(b) means for graphically displaying said display forms based on said drawing data signals which are obtained by said receiving and classifying means (a).

11. An inspection data analyzing apparatus for in-line inspection which analyzes detected defect data signals which are obtained on a semiconductor wafer by an inspection apparatus, comprising:
(a) means for receiving said detected defect data signals and for classifying said detected defect data signals in accordance with defect sizes thereof, to thereby generate drawing data signals which provide different display forms to said classified detected defect data signals; and
(b) means for graphically displaying said display forms based on said drawing data signals which are obtained by said receiving and classifying means (a);
wherein said receiving and classifying means (a) generates drawing data signals which provide a chip arrangement, and
said displaying means (b) graphically displays said display forms on said chip arrangement.

12. An inspection data analyzing apparatus for in-line inspection which analyzes detected defect data signals which are obtained on a semiconductor wafer by an inspection apparatus, comprising:
(a) means for receiving said detected defect data signals and for classifying said detected defect data signals in accordance with defect sizes thereof, to thereby generate drawing data signals which provide different display forms to said classified detected defect data signals; and
(b) means for graphically displaying said display forms based on said drawing data signals which are obtained by said receiving and classifying means (a);
wherein said receiving and classifying means (a) generates drawing data signals which provide a defect distribution map of said semiconductor wafer, and
said displaying means (b) graphically displays said display forms on said defect distribution map of said semiconductor wafer.

13. An inspection data analyzing apparatus for in-line inspection which analyzes detected defect data signals which are obtained on a semiconductor wafer by an inspection apparatus, comprising:
(a) means for receiving said detected defect data signals and for classifying said detected defect data signals in accordance with defect sizes thereof, to thereby generate drawing data signals which provide different display forms to said classified detected defect data signals; and
(b) means for graphically displaying said display forms based on said drawing data signals which are obtained by said receiving and classifying means (a);
wherein said receiving and classifying means (a) generates drawing data signals which provide a chip arrangement map and a defect distribution map of said semiconductor wafer as they overlap each other, and
said display means (b) graphically displays forms on said defect distribution map of said semiconductor wafer on which said chip arrangement map is drawn.

14. The inspection data analyzing apparatus for in-line inspection according to claim 10, wherein
said receiving and classifying means (a) obtains the drawing data signals per chip, and
said displaying means (b) graphically displays said defect density signals per chip based on said drawing data signals generated by said receiving and classifying means (a).

15. An inspection data analyzing apparatus for in-line inspection which analyzes detected defect data signals which are obtained on a semiconductor wafer by an inspection apparatus, comprising:

(a) means for receiving said detected defect data signals and for classifying said detected defect data signals in accordance with defect sizes thereof, to thereby generate drawing data signals which provide different display forms to said classified detected defect data signals; and (b) means for graphically displaying said display forms based on said drawing data signals which are obtained by said receiving and classifying means (a);

said receiving and classifying means (a) obtains defect density data signals per chip;

said displaying means (b) graphically displays said display forms per chip based on said drawing data signals obtained by said receiving and classifying means (a); and said receiving and classifying means (a) generates drawing data signals which provide a chip arrangement map and a defect distribution map of said semiconductor wafer as they overlap each other, and said displaying means (b) graphically displays said forms on said defect distribution map of said semiconductor wafer on which said chip arrangement map is drawn.

16. An inspection data analyzing apparatus for in-line inspection which analyzes detected defect data signals which are obtained on a semiconductor wafer including at least one chip by an inspection apparatus after an optional point of time after two or more steps of inspection steps are complete, comprising:

(a) means for receiving said detected defect data signals and for obtaining defect density data signals which provide defect densities per chip based on said detected defect data signals, to thereby generate first drawing data signals for display values of said defect density data signals as numerical values, and second drawing data signals which provide a chip arrangement map and a defect distribution map of said semiconductor wafer as they overlap each other, for each one of inspection steps; and (b) means for displaying both said first drawing data signals and said second drawing data signals which are obtained by said receiving and obtaining means (a), for each one of said inspection steps.

17. An inspection data analyzing apparatus for in-line inspection which analyzes detected defect data signals which are obtained on a semiconductor wafer including at least one chip by an inspection apparatus after two or more step of inspection steps are complete, comprising:

(a) means for receiving said detected defect data signals, for obtaining critical ratio data signals which provide defect critical ratios per chip based on said detected defect data signals, and for judging to which one of levels assigned in advance, each one of said critical ratio data signals belongs, to thereby generate first drawing data signals which provide each one of said levels to which each one of said critical ratio data signals belongs with predetermined display forms, for each one of inspection steps;

(b) means for generating second drawing data signals which provide a chip arrangement map and a defect distribution map of said semiconductor wafer as they overlap each other, for each one of said inspection steps; and (c) means or graphically displaying said display forms based on said first and second drawing data signals for each one of said inspection steps.

* * * * *